(12) United States Patent
Nagata et al.

(10) Patent No.: US 6,759,666 B2
(45) Date of Patent: Jul. 6, 2004

(54) METHOD AND APPARATUS FOR CHARGED PARTICLE BEAM EXPOSURE

(75) Inventors: Koji Nagata, Hachioji (JP); Haruo Yoda, Hinode (JP); Hidetoshi Satoh, Kodaira (JP); Hiroyuki Takahashi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 393 days.

(21) Appl. No.: 09/924,575

(22) Filed: Aug. 9, 2001

(65) Prior Publication Data
US 2002/0027198 A1 Mar. 7, 2002

(30) Foreign Application Priority Data
Aug. 10, 2000 (JP) ....................... 2000-243202

(51) Int. Cl.[7] ............................................ G21G 5/10
(52) U.S. Cl. ..................... 250/492.22; 250/492.23; 250/492.2
(58) Field of Search ................ 250/492.22, 492.23, 250/492.2, 348, 398

(56) References Cited

U.S. PATENT DOCUMENTS 5,260,579 A  * 11/1993 Yasuda et al. ........... 250/492.2

FOREIGN PATENT DOCUMENTS

| JP | 5-175108 | 7/1993 |
|----|----------|--------|
| JP | 5-206016 | 8/1993 |
| JP | 6-53129 | 2/1994 |
| JP | 6-302506 | 10/1994 |
| JP | 9-63926 | 3/1997 |

OTHER PUBLICATIONS

H. Yasuda et al, "Multielectron Beam Blanking Aperture Array System SYNAPSE–2000", Jounal of Vacuum Science & Technology, B 14 (6), Nov./Dec. 1996, pp. 3813–3820.

* cited by examiner

Primary Examiner—Hai Pham
Assistant Examiner—Lam S Nguyen
(74) Attorney, Agent, or Firm—Mattingley, Stanger & Malur, P.C.

(57) ABSTRACT

A plurality of circuit patterns are written by a small number of charged particle beams with a high dimension controllability without using a mask.

A desired charge quantity is irradiated on a desired point on a sample by performing irradiation on a charged particle beam section in a superposing manner in order to obtain a predetermined exposure intensity by the charged particle beams constituting a plurality of charged particle beam groups. In addition, the charged particle beams are used, in which current quantities of a plurality of the charged particle beams are made to have a weighted gradation, the desired charged quantity is irradiated, and thus a desired exposure dimension is obtained.

7 Claims, 21 Drawing Sheets

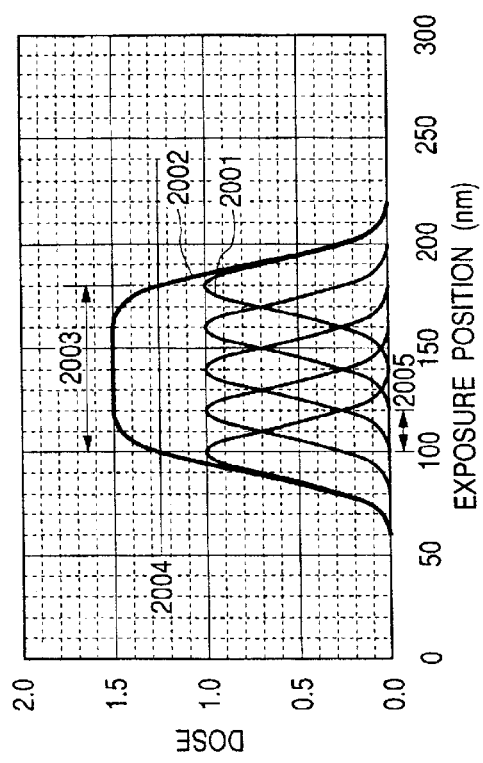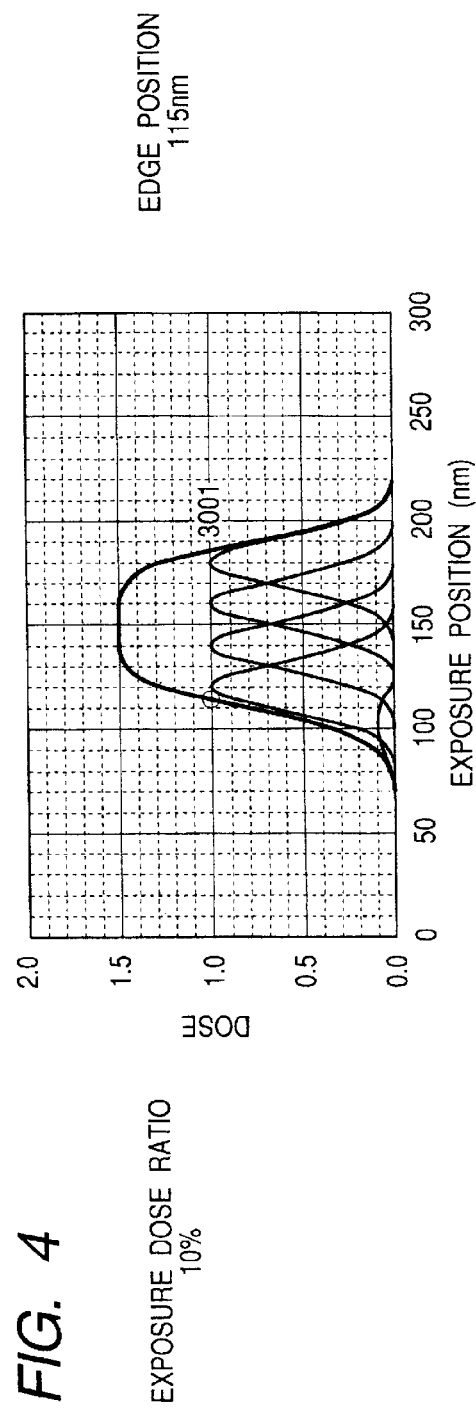
FIG. 3
FIG. 4

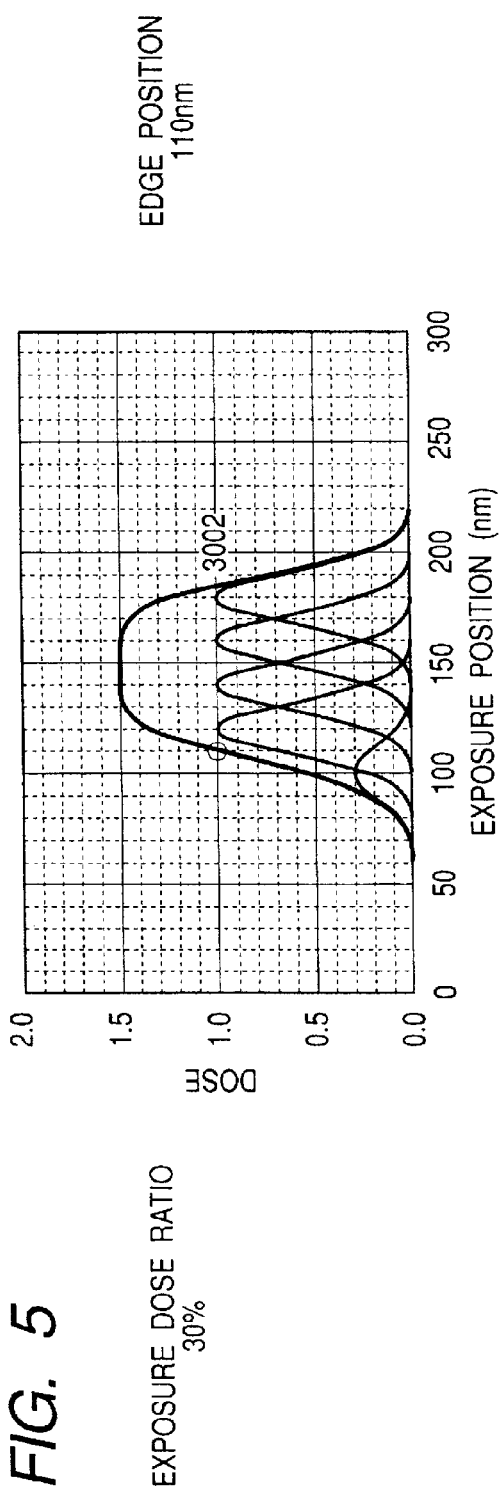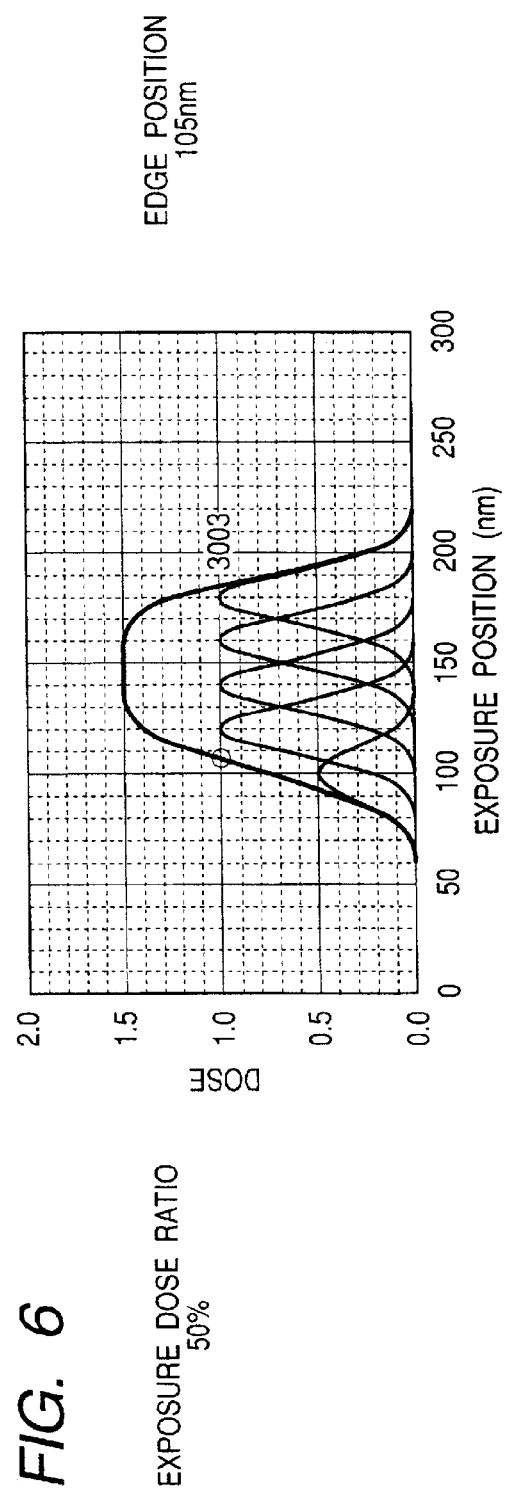
FIG. 5
FIG. 6

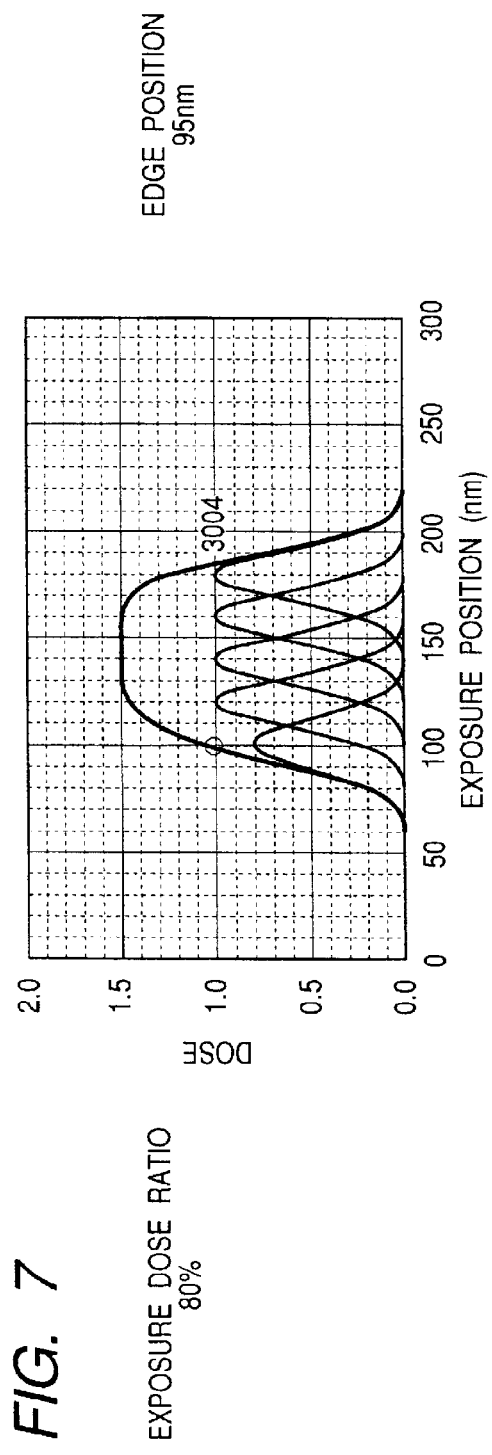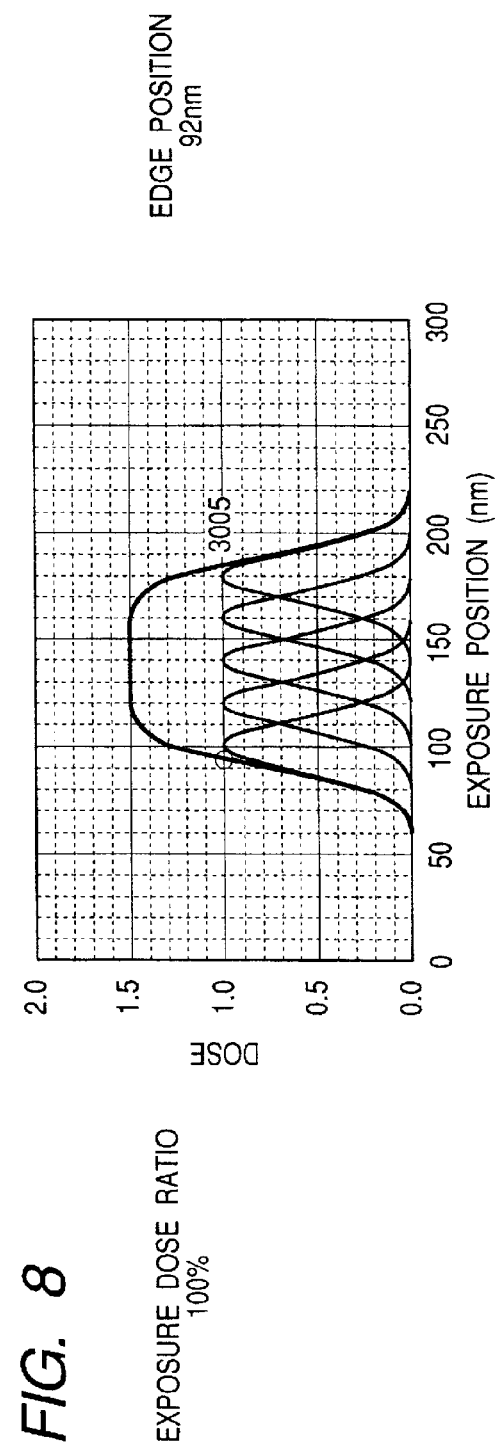

|   | a | b | c | d | e |
|---|---|---|---|---|---|
| 6 | 0 | 0 | 33 | 33 | 11 |
| 5 | 0 | 0 | 100 | 100 | 33 |
| 4 | 0 | 0 | 100 | 100 | 33 |
| 3 | 11 | 33 | 100 | 100 | 33 |
| 2 | 33 | 100 | 100 | 100 | 33 |
| 1 | 11 | 66 | 66 | 66 | 22 |

ROW (Y) / COLUMN (X)

DATA MAP OF EXPOSURE NUMBER

DATA OF EXPOSURE DOSE

TIME T3

METHOD AND APPARATUS FOR CHARGED PARTICLE BEAM EXPOSURE

BACKGROUND OF THE INVENTION

The present invention relates to a method and an apparatus for charged particle beam exposure that control charged particle beams and exposes a pattern of LSI and the like on a sample, more particularly to a method and an apparatus for charged particle beam exposure that use a plurality of charged particle beams.

In a charged particle beam exposure apparatus, such as an electron beam exposure apparatus, which exposes an LSI pattern on the sample by using the charged particle beams, a multibeam exposure system using a plurality of the charged particle beams has been proposed for improving the processing capability (throughput) of the apparatus. As an example of the conventional art of the multibeam exposure system, a blanking aperture array system is cited (H. Yasuda, J. VAC. Sci. Technol., B14 (6), 1996). In this system, a blanking aperture array formed of a plurality of aperture groups is used, which has a blanking electrode capable of independent control of an applied voltage. An electron beam from a single electron source is divided into a plurality of electron beams, and turning on/off of each electron beam is controlled by the blanking electrode capable of independent control. Thus, a beam shape formed by the group of the electron beams that consist of a plurality of the electron beams can be arbitrarily set. Accordingly, the throughput of the apparatus is improved because the electron beam of any shape can be obtained.

In the above-described conventional art, the dimension of the electron beam divided by the blanking aperture array is as large as approximately 100 nm on the sample, and the system is the one that divides the single charged particle beam. There existed a problem that the number of charged particle beams obtained has been limited to several hundred to one thousand, which has caused limitation to a dimension control of a pattern to be exposed and insufficient resolving power. In addition, error occurs in the exposure of proximate portions due to exposure dose distribution generated by scattering of the electrons in resist, reflected electrons from a sample surface or the like. There existed another problem that a special processing process has been required for a proximate effect correction for correcting the error. Such problems are apt to be more apparent as the exposure pattern becomes finer.

In the blanking aperture array system in the prior art lightens the problems as follows. Firstly, regarding the problem of insufficient dimension resolving power, a method for controlling an exposure dimension in a dimension unit finer than an electron beam dimension obtained by dividing the electron beam is disclosed in Japanese Patent Laid-Open No. Hei6(1994)-302506 gazette. This method is the one in which a pattern dimension is controlled in a finer dimension than the electron beam dimension, which is performed as follows. The apertures of the blanking aperture array are formed such that the apertures that belong to adjacent columns are arranged in the finer dimension unit than the dimension of the aperture in a shifted state. As apertures for exposing an end portion of the pattern, the apertures in a shifted relation are selected from each column in plural numbers in accordance with the dimension of the pattern to be exposed. Then, each of the electron beams generated from the apertures is irradiated in a superposing manner to control exposure dose at the end portion of the pattern. In this system, a high processing accuracy is required for processing the apertures in a positional accuracy between the apertures. Moreover, a higher processing accuracy and an increase of the number of apertures are required in order to make a dimension control resolving power finer by improving the resolving power of a shift amount. Furthermore, there exists a problem that a control circuit of the blanking aperture array becomes complex because selection of the apertures for exposing the end portion of the pattern is necessary depending on the pattern dimension.

The proximity effect correction is the one, as disclosed in Japanese Patent Laid-Open No. Hei5(1993)-175018 gazette, No. Hei5(1993)-206016 gazette and No. Hei6(1994)-53129 gazette, in which a correction exposure process is performed for correcting an exposure dose error by a proximity effect occurred in an exposure process in addition to an actual pattern exposure process. In this method, reduction of the throughput is inevitable because the number of exposure processes is increased. As a method that does not require the correction exposure process, there exists a system as disclosed in Japanese Patent Laid-Open No. Hei9(1997)-63926 that data in which exposure data for correcting the exposure error by pattern data is added to the pattern data is formed prior to exposure and a corrected pattern is obtained by one exposure process. In this system, a long time is consumed since conditions need to be obtained by generation of the pattern data and a test writing, which leads to reduction of a total throughput of the apparatus.

SUMMARY OF THE INVENTION

In the present invention, a charged particle beam exposure method and a charged particle beam exposure apparatus described in each claim are adopted to solve the problems in the above-described conventional art. A beam source may be either plural or single. Specifically, in the charged particle beam exposure apparatus that exposes an LSI pattern or the like by irradiating a group of the charged particle beams formed by a plurality of the charged particle beams on a sample, the charged particle beams that constitute a plurality of the charged particle beam groups is irradiated in a superposing manner to a specified section of a specified pattern (a charged particle beam section) to obtain a predetermined exposure intensity. Thus, a desired charge quantity is irradiated on a desired point on the sample, and a desired exposure dimension is obtained.

In addition, a plurality of the charged particle beams are used, of which current quantities are made to have a weighted gradation, the desired charge quantity is irradiated, and thus the desired exposure dimension is obtained.

A map for a number of shots determined by the dimension resolving power in a mesh and an exposure dose map based on introduction of an existence density concept of the pattern across a plurality of meshes are formed, and data of the maps is given to the charged particle beams side as data. Accordingly, the charged particle beams are allowed to have a high gradation capable of the exposure dose correction necessary for the proximate effect correction.

Therefore, even if the size of the mesh allocated on the sample is large, the number of gradations can be set by finely controlling an irradiated charge quantity of the charged particle beams and high dimension controllability is obtained. Thus, the number of beams forming the charged particle beam group can be considerably reduced and the beam source and a control apparatus can be simplified. Additionally, since the data for irradiation is corrected regarding the proximate effect correction, the throughput is improved because a special process is not required.

BRIEF DESCRIPTION OF THE DRAWINGS

FIG. 3 is a view explaining a relation between an exposure dose and a dimension.

FIG. 4 is a view explaining an example where the exposure dose of an end portion is varied.

FIG. 5 is a view explaining an example where the exposure dose of the end portion is varied.

FIG. 6 is a view explaining an example where the exposure dose of the end portion is varied.

FIG. 7 is a view explaining an example where the exposure dose of the end portion is varied.

FIG. 8 is a view explaining an example where the exposure dose of the end portion is varied.

PREFERRED EMBODIMENTS OF THE INVENTION

In the followings, description will be made for embodiments of the present invention with reference to the drawings.

Figure 1:
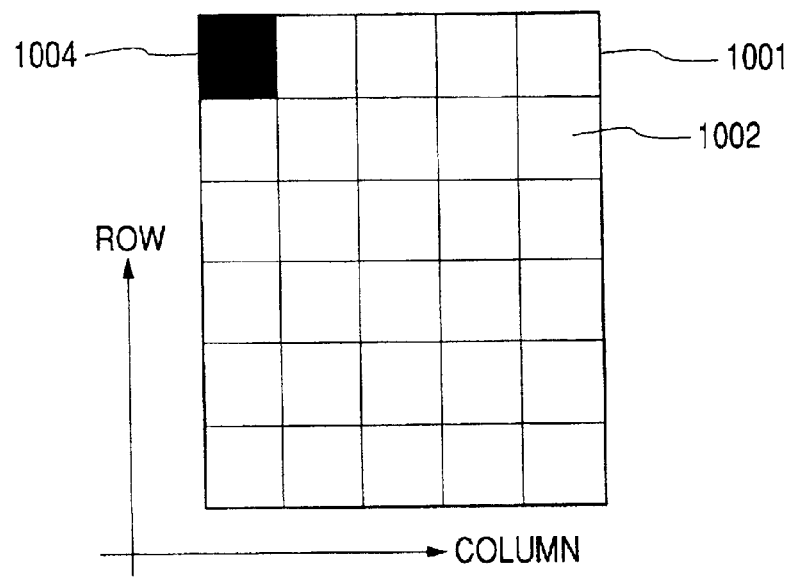
FIG. 1 is a view explaining a constitution of a matrix of charged particle beams.
Figure 2:
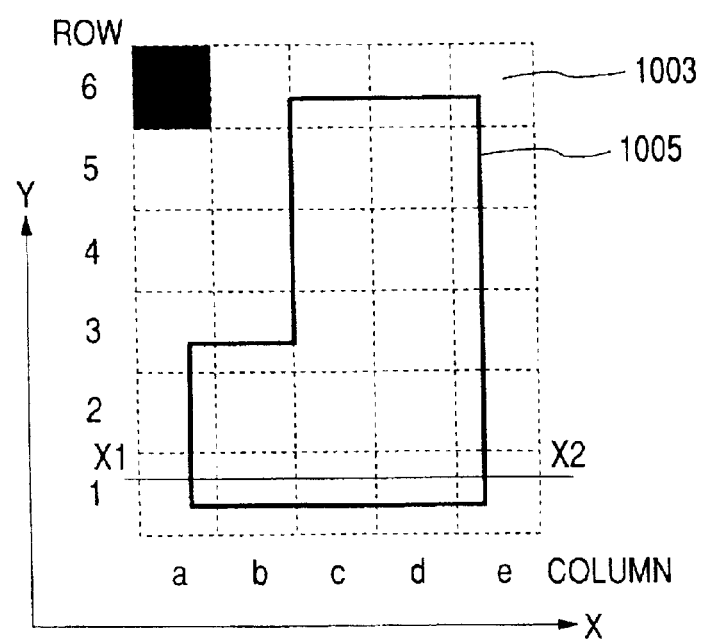
FIG. 2 is a view explaining a constitution of a mesh.

FIGS. 1 and 2 are views for explaining a method of a writing processing according to the embodiments of the present invention. In the present invention, a group of a plurality of charged particle beams forms a matrix 1001 of charged particle beams, in which the charged particle beams 1002 are arranged in a matrix defined by rows and columns perpendicular to each other as shown in FIG. 1. A writing region is divided in a mesh state defined by rows and columns perpendicular to each other as shown in FIG. 2. Dimensions of mesh 1003 equals to dimensions of one charged particle beam source 1004, which constitutes the matrix 1001 of charged particle beams, when reduced and projected on a sample. In addition, as shown in FIG. 2, the dimensions of the mesh 1003 is set larger than a dimension resolving power of an exposure pattern 1005. Therefore, dimensions of the exposure pattern are not necessarily equal to a multiple of the dimensions of the mesh 1003.

Next, description will be made in FIG. 3 and FIGS. 4 to 8 for a method of obtaining the dimension resolving power smaller than the large beam dimensions shown in FIG. 1. In FIG. 3, an axis of abscissas shows an exposure position (unit:nm) and an axis of ordinates shows an exposure dose (optional unit). FIG. 3 shows an exposure dose 2001 of a single charged particle beam and a total exposure dose 2002 obtained as a result thereof supposing that the irradiation dose by each beam constituting the matrix of the charged particle beams has the Gaussian distribution. The total exposure dose 2002 finally obtained is an integral value of the irradiation dose given by each beam. An exposure pattern size 2003 is determined by a region of the total exposure dose 2002 that exceeds a sensitivity threshold value 2004 of a photosensitive material. In a conventional exposure method, the total exposure dose 2002 has been controlled to obtain desired dimensions by allowing the beam including the exposure dose of the Gaussian distribution in FIG. 3 to be positioned and irradiated in an unit equal to a desired dimension resolving power or finer.

On the contrary, as shown in FIG. 3 in the present invention, the beam including the exposure doze 2001 of the Gaussian distribution is used, a plurality of the beams are arranged in a matrix, and a beam intensity at an end portion is controlled. Thus, the pattern size can be optionally selected.

Total exposure dose 3001, 3002, 3003, 3004 and 3005 in FIGS. 4 to 8 shows the exposure dose of the position of a line X1–X2 in FIG. 2, and each Gaussian distribution shows the exposure dose of the columns "a" to "e" of a first row of the mesh. Moreover, a size of each beam and a pitch of the mesh are set at 20 nm. Each graph shows the exposure dose of a single charged particle beam and the total exposure dose when the exposure dose of the "a" column of the first row is varied from 10% to 100%. In the case where the sensitivity threshold value of the photosensitive material is made to be 1.0 on the axis of ordinates in the graph, a pattern edge position in each state is shown by a position of circle in each of FIGS. 4 to 8, which changes in the resolving power at 5 nm or less for changes of the exposure dose. As described above, the exposure dose of each beam is varied in accordance with the desired dimensions. Thus, a desired pattern dimension control is enabled by the beam having a larger size or arranged in a larger distance than the pattern dimension resolving power.

Figure 9:
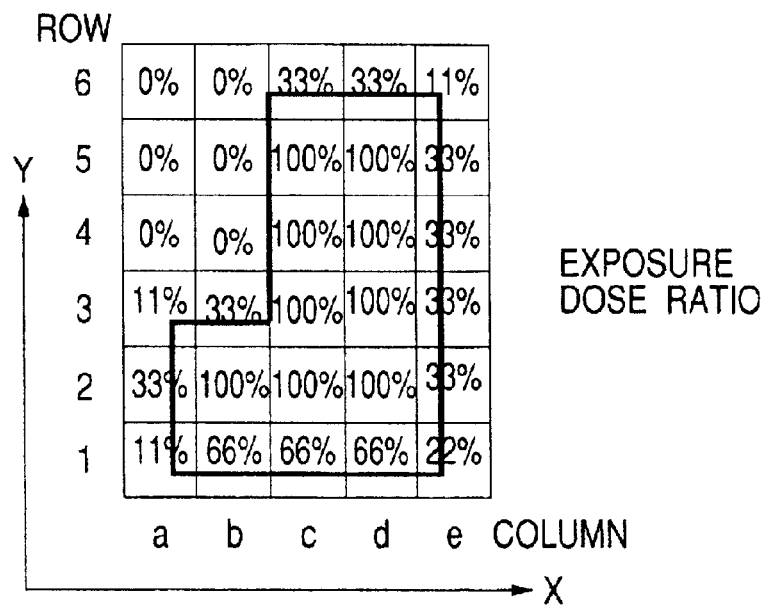
FIG. 9 is a view explaining an example of ratio data.
Figure 10:
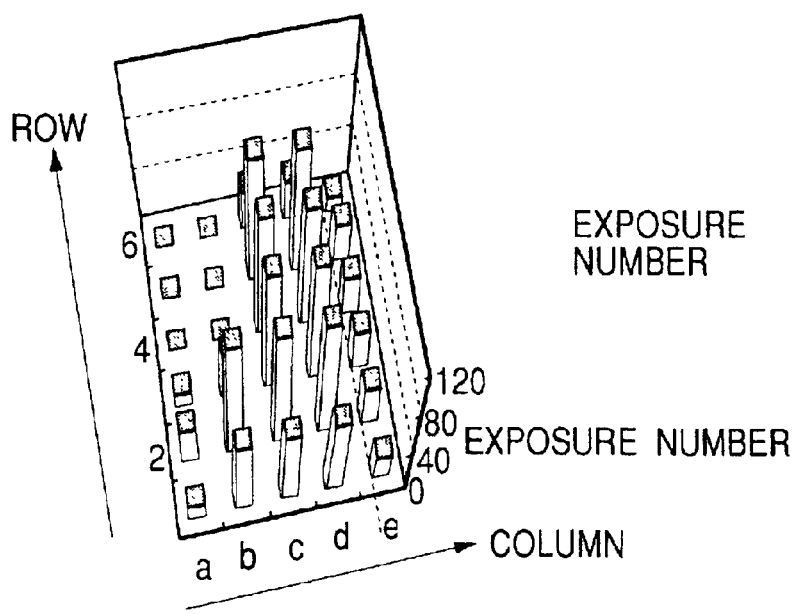
FIG. 10 is a view explaining an example of number data of exposure.

In the present invention, a ratio of the dimensions (area) of a pattern included in each mesh to the mesh dimensions (area) is used as an index as shown in FIGS. 9 and 10, and the exposure dose to each mesh is varied depending on the ratio data. A percentage of the dimensions (area) of the pattern in the mesh dimensions (area) is decided to determine the minimum unit. A series of this operation is a gradation process. In addition, the exposure dose to each mesh is not controlled by varying a current quantity or an exposure time of the beam for exposure. Instead, the exposure dose is varied in a method that a deflection control of the matrix of charged particle beams is performed in a column direction on the sample, the same mesh is subjected to a superposing exposure by different beams in the same column, and the number of superposing exposure to each mesh is controlled by the dimension ratio data. Accordingly, the exposure dose to each mesh can be controlled by the number of superposing exposures, and the desired exposure dose can be obtained for every mesh. For example, in the case where one hundred beams having the same current quantity are arrayed in a column direction, the exposure dose of 1% is controlled if any one of these beams is turned on. In the case of the ratio of 33%, thirty-three beams are turned on, and are used to the superposing exposure (the exposure is performed by thirty-three times to the same mesh). Thus, the desired exposure dose is obtained.

Figure 11:
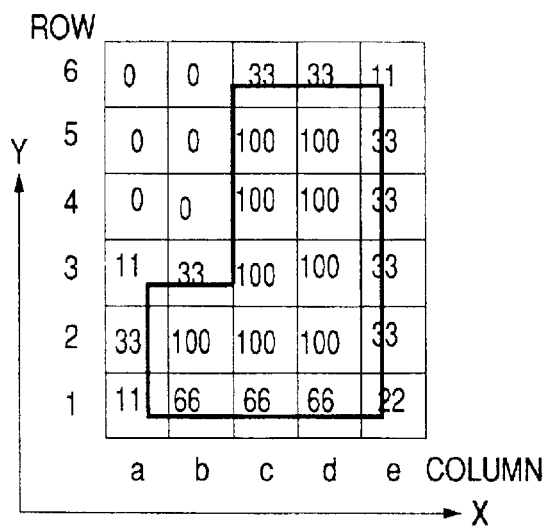
FIG. 11 is a view explaining an example of the number data of exposure.

FIG. 11 shows the exposure dose of each mesh depending on the ratio data. For example, a mesh (2, a) has the exposure dose of 33%, which implies that the superposing exposure is performed by thirty-three times when it is shown by the number of shots of the charged particle beams that are not weighted. Herein, description will be made regarding the columns from "a" to "e" of the first row. A matrix 5001 of charged particle beams has a constitution of one hundred rows and five columns (a, b, c, d, e), and all the beams have the equal current quantities. A beam (shown by (1, a)) irradiated on the mesh of "a" column of the first row is represented as a gradation number of eleven. This means that the beams from the first row to the eleventh row in the "a" column of the matrix 5001 of charged particle beams are deflected with a deflection unit and sequentially irradiated on the same position corresponding to the mesh (1, a) of the sample in a superposing manner. The beam irradiated on a mesh (1, b) has the number of superposing exposures of sixty-six, that is, the gradation number of sixty six having one hundred as the maximum number. Accordingly, the beams from the first row to the sixty-sixth row in the "b" column of the matrix 5001 of charged particle beams are deflected with the deflection unit and sequentially irradiated on the same position of the sample in a superposing manner. Since the beam irradiated on a mesh (1, c) has the gradation number of sixty six, the beams from the first row to the sixty-sixth row in the "c" column of the matrix 5001 of charged particle beams are deflected with the deflection unit and sequentially irradiated on the same position of the sample in a superposing manner. Since the beam irradiated on a mesh (1, d) has the gradation number of sixty-six, the beams from the first row to the sixty-sixth row in the "d" column of the matrix 5001 of charged particle beams are deflected with the deflection unit and sequentially irradiated on the same position corresponding to the mesh (1, d) of the sample in a superposing manner. Since the beam irradiated on a mesh (1, e) in FIG. 11 has the gradation number of twenty-two, the beams from the first row to the twenty-second row in the "e" column of the matrix 5001 of charged particle beams are deflected with the deflection unit and sequentially irradiated on the same position of the sample in a superposing manner.

Figures 13, 14:
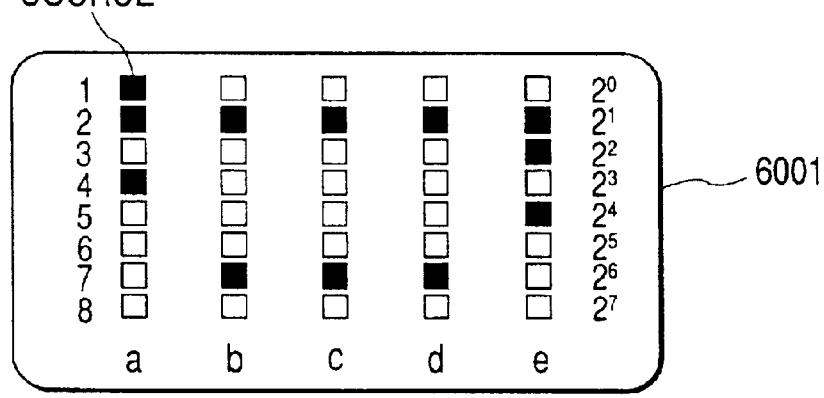
FIG. 13 is a view explaining an example of the number data of exposure.
FIG. 14 is a view explaining an example of an exposure pattern of the matrix of charged particle beams.
Figure 15:
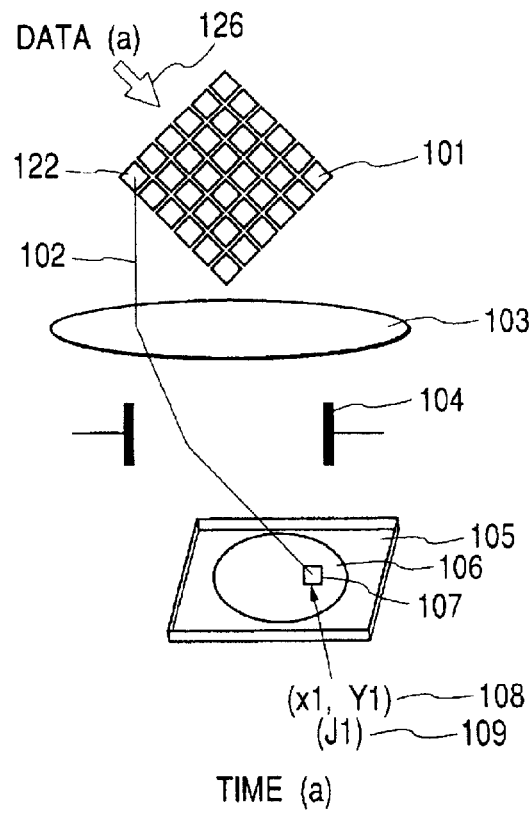
FIG. 15 is a view explaining an exposure procedure.

FIG. 13 is a result that the exposure dose is converted to the gradation number of each mesh depending on the ratio data, which explains a specific exposure method in accordance with the result. Herein, description will be made also for the meshes of the columns from "a" to "e" of the first row. In the case of this example, a matrix 6001 of charged particle beams has a constitution of eight rows and five columns (a, b, c, d, e), and a weight of the beam current quantity is set at a power of 2 for each row. Therefore, the maximum gradation number of two hundred and fifty six is possible in this system. Since the beam irradiated on a mesh (1, a) in FIG. 13 has the gradation number of eleven, the beams of the first, the second and the fourth rows in the "a" column of the matrix 6001 of charged particle beams are deflected with the deflection unit and sequentially irradiated on the same position corresponding to the mesh (1,a) of the sample in a superposing manner. Accordingly, the exposure dose of $2^0+2^1+2^3=1+2+8=11$ is given to the mesh (1, a). Since the beam irradiated on a mesh (1, b) has the gradation number of sixty-six, the beams of the second and the seventh rows in the "b" column of the matrix 6001 of charged particle beams are deflected with the deflection unit and sequentially irradiated on the same position corresponding to the mesh (1, b) of the sample in a superposing manner. Accordingly, the exposure dose of 2+64=66 is given to the mesh (1, b) in FIG. 13. Since the beam irradiated on a mesh (1, c) in FIG. 13 has the gradation number at sixty six, the beams of the second and the seventh rows in the "c" column of the matrix 6001 of charged particle beams are deflected with the deflection unit and sequentially irradiated on the same position corresponding to the mesh (1, c) of the sample in a superposing manner. Accordingly, the exposure dose of 2+64=66 is given to the mesh (1, c). Since the beam irradiated on a mesh (1, d) in FIG. 13 has the gradation number of sixty-six, the beams of the second and the seventh rows in the "d" column of the matrix 6001 of charged particle beams are deflected with the deflection unit and sequentially irradiated on the same position corresponding to the mesh (1, d) of the sample in a superposing manner. Accordingly, the exposure dose of 2+64=66 is given to the mesh (1, d). Since the beam irradiated on a mesh (1, e) in FIG. 13 has the gradation number of twenty-two, the beams of the second, the third and the fifth rows in the "e" column of the matrix 6001 of charged particle beams are deflected with the deflection unit and sequentially irradiated on the same position corresponding to the mesh (1, e) of the sample in a superposing manner. Accordingly, the exposure dose of 2+4+16=22 is given to the mesh (1, e). In this system, the charged particle beams where the current quantities are weighted are used, and the number of beams constituting the matrix of charged particle beams can be significantly reduced in comparison to the charged particle beams having a single current quantity.

Writing operation including the deflection control of the present invention will be described with reference to FIGS. 15 to 18. Each charged particle beam emitted from a matrix of charged particle beams 101 is reduced by a lens 103 by an optional value, positioned by a deflection unit 104, and irradiated on a sample 106 mounted on a sample stage 105. FIG. 15, FIG. 16, FIG. 17 and FIG. 18 show states of an exposure operation arranged in a time series. Description will be made only for four charged particle beams (122, 123, 124 and 125) in the matrix 101 of charged particle beams. Firstly, in a state of FIG. 15, ratio data (a) 126 is given to the matrix 101 of charged particle beams. The data (a) shows the number of superposing exposures to a mesh 107, and four times are specified in this case. The charged particle beam 122 goes through a route 102 to reach the mesh 107 on the sample 106. Coordinates 108 of the mesh 107 on the sample are (x1, y1), and a charge quantity 109 irradiated is J1.

Figure 16:
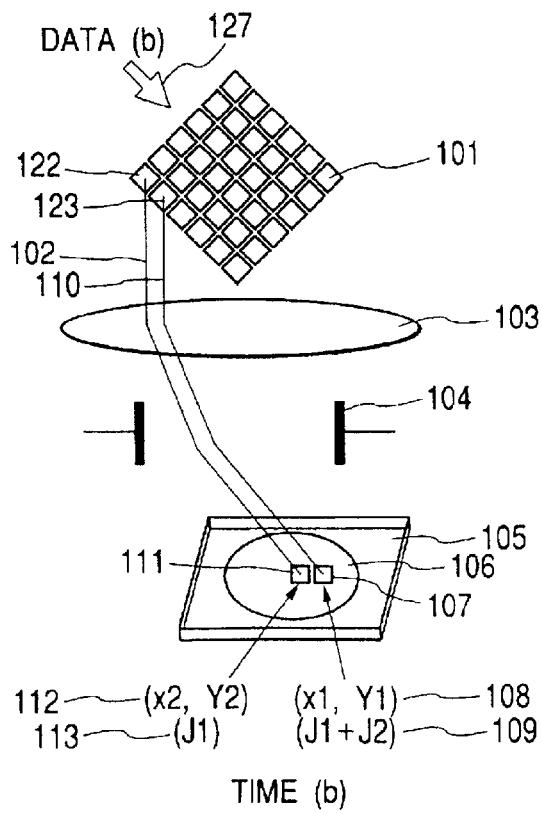
FIG. 16 is a view explaining the exposure procedure.

Next, the writing operation moves to the state of FIG. 16. Ratio data (b) 127 is given to the matrix 101 of charged particle beams. The data (b) shows the number of superposing exposures to a mesh 111, where one time is specified. Each charged particle beam is deflected by the deflection unit 104 more to the left side on the drawing in comparison to the state of FIG. 15. Accordingly, the charged particle beam 122 goes through the route 102 to reach the mesh 111 on the sample 106. Coordinates 112 of the mesh 111 on the sample at this time are (x2, y2), and a charge quantity 113 irradiated is J1. The charged particle beam 123 goes through a route 110 to reach the mesh 107 on the sample 106. The coordinates 108 of the mesh 107 on the sample at this time are (x1, y1), which coincides with a point irradiated by the charged particle beam 122 at the state of FIG. 15. Therefore, the second exposure is performed on the mesh 107, and the charge quantity 109 becomes J1+J2.

Figure 17:
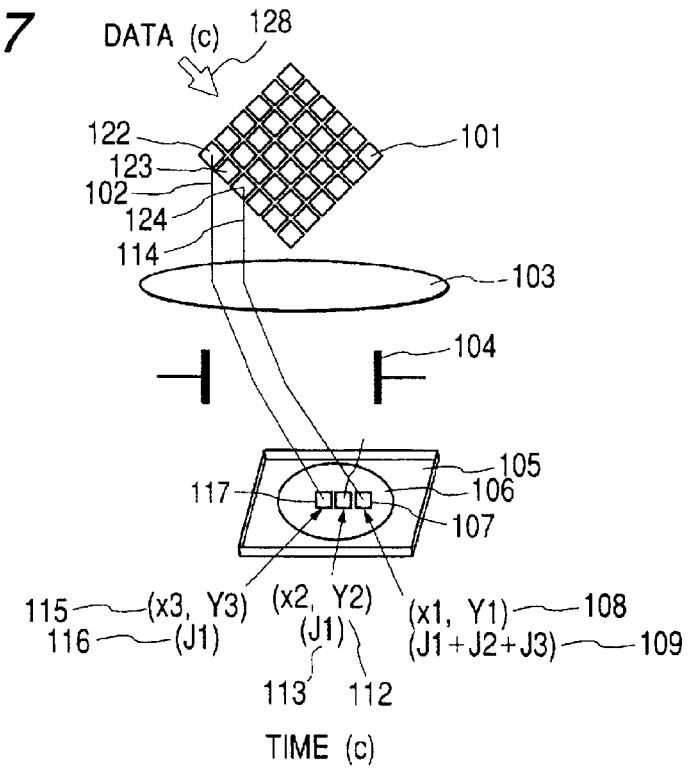
FIG. 17 is a view explaining the exposure procedure.

Next, the writing operation moves to the state of FIG. 17. Ratio data (c) 128 is given to the matrix 101 of charged particle beams. The data (c) shows the number of superposing exposures to a mesh 117, where two times is specified. Each charged particle beam is deflected by the deflection unit 104 more to the left side on the drawing in comparison to the state of FIG. 16. Accordingly, the charged particle beam 122 goes through the route 102 to reach the mesh 117 on the sample 106. Coordinates 115 of the mesh 117 on the sample at this time are (x3, y3), and a charge quantity 116 irradiated is J1. The charged particle beam 124 goes through a route 114 to reach the mesh 107 on the sample 106. Coordinates 108 of the mesh 107 on the sample at this time are (x1, y1), which coincides with the point irradiated by the charged particle beam 122 at the state of FIG. 15 and a point irradiated by the charged particle beam 123 at the state of FIG. 16. Therefore, the third exposure is performed on the mesh 107, and the charge quantity 109 becomes J1+J2+J3. As to the mesh 111, since the number of superposing exposures of one time is specified, no exposure is performed. Accordingly, the charged particle beam 123 is not generated.

Figure 18:
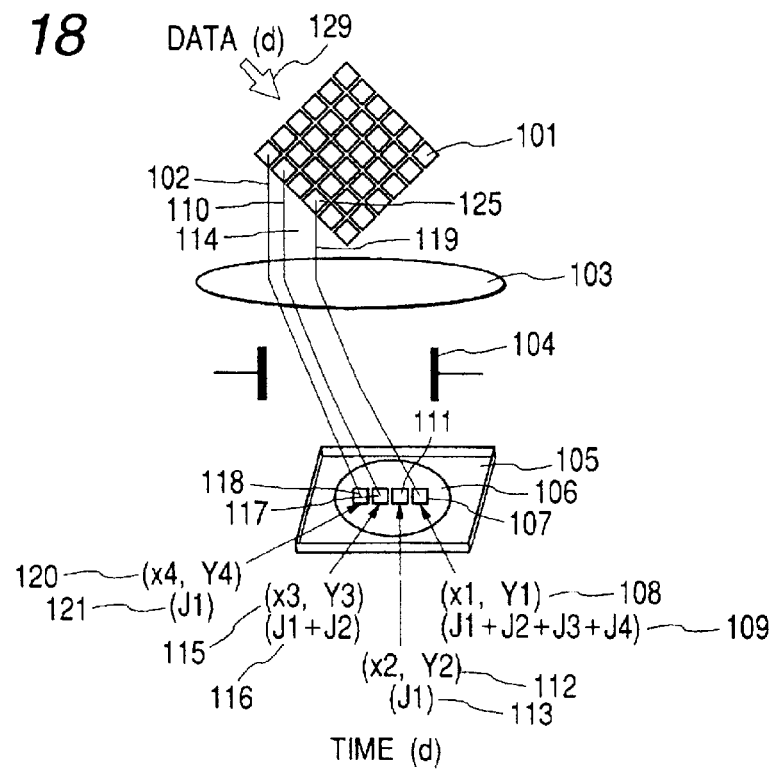
FIG. 18 is a view explaining the exposure procedure.

Next, the writing operation moves to the state of FIG. 18. Ratio data (d) 129 is given to the matrix 101 of charged particle beams. The data (d) shows the number of superposing exposures to a mesh 118, where one time is specified. Each charged particle beam is deflected by the deflection unit 104 more to the left side on the drawing in comparison to the state of FIG. 17. Accordingly, the charged particle beam 122 goes through the route 102 to reach the mesh 118 on the sample 106. Coordinates 120 of the mesh 118 on the sample at this time are (x4, y4), and a charge quantity 121 irradiated is J1. The charged particle beam 123 goes through a route 110 to reach the mesh 117 on the sample 106. The coordinates 115 of the mesh 117 on the sample at this time are (x3, y3), which coincides with the point irradiated by the charged particle beam 122 having an area at the state of FIG. 17. Therefore, the second exposure is performed on the mesh 117, and the charge quantity 116 becomes J1+J2. The charged particle beam 125 goes through a route 119 to reach the mesh 107 on the sample 106. The coordinates 108 of the mesh 107 on the sample at this time are (x1, y1), which coincides with the point irradiated by the charged particle beam 122 at the state of FIG. 15, the point irradiated by the charged particle beam 123 at the state of FIG.16 and a point irradiated by the charged particle beam 124 at the state of FIG. 17. Therefore, the fourth exposure is performed on the mesh 107, and the charge quantity 109 becomes J1+J2+J3+J4. Since the specified number of superposing exposures of one time is completed to the mesh 111 at the state of FIG. 16, the charged particle beam 124 is not generated.

In the foregoing, the superposing exposure is completed: four times to the mesh 107; one time to the mesh 111; two times to the mesh 117; and one time to the mesh 118.

Figure 12:
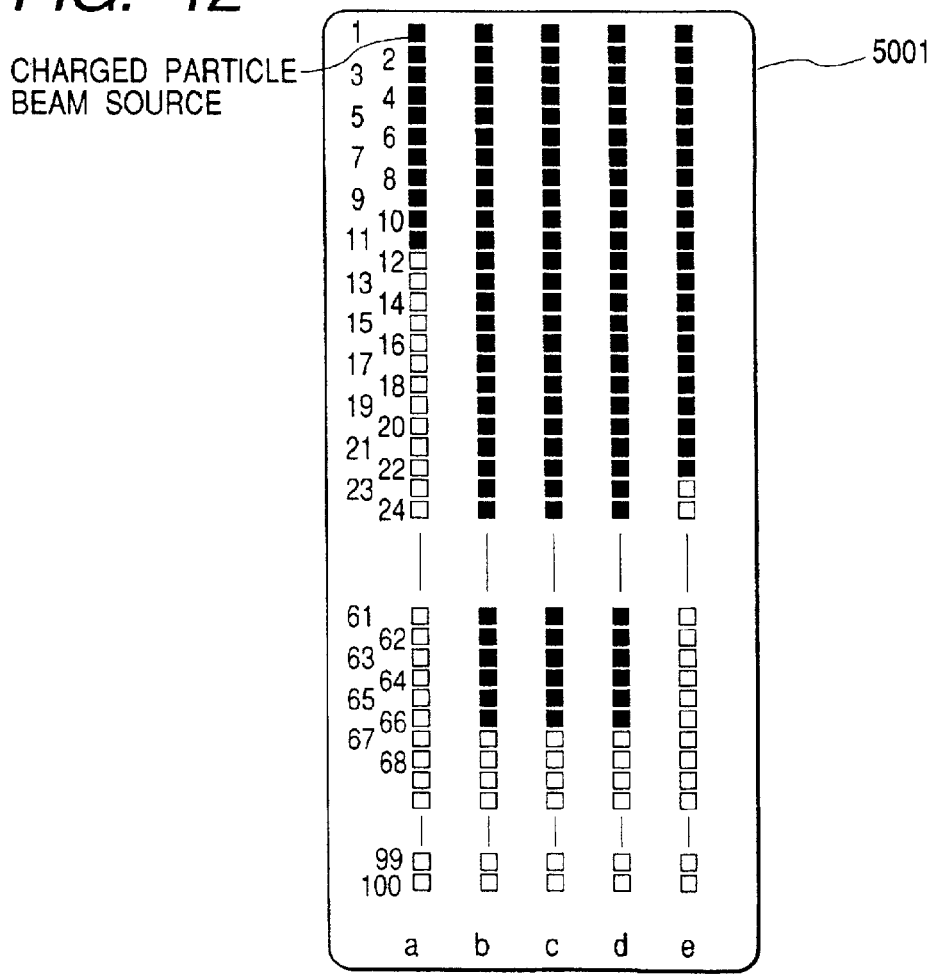
FIG. 12 is a view explaining an example of an exposure pattern of the matrix of charged particle beams.

As described above, it was found out that the number of charged particle beams can be reduced when the matrix 6001 of charged particle beams as shown in FIG. 14 is used, where the current is weighted to the charged particle beams, instead of the matrix 5001 of charged particle beams that are equal to each other as shown in FIG. 12. Generation and non-generation of each of a plurality of the charged particle beams that constitute the matrix of charged particle beams are controlled, a group of the charged particle beams generated is controlled and deflected, and then the different charged particle beams constituting the group of the charged particle beams are irradiated on the same point of the sample in a superposing manner. Thus, a desired charge quantity can be irradiated on a desired mesh on the sample, and it is also possible to allow the exposure dose of every mesh to have the gradation. Accordingly, the dimensions can be controlled.

First Embodiment

Figure 19:
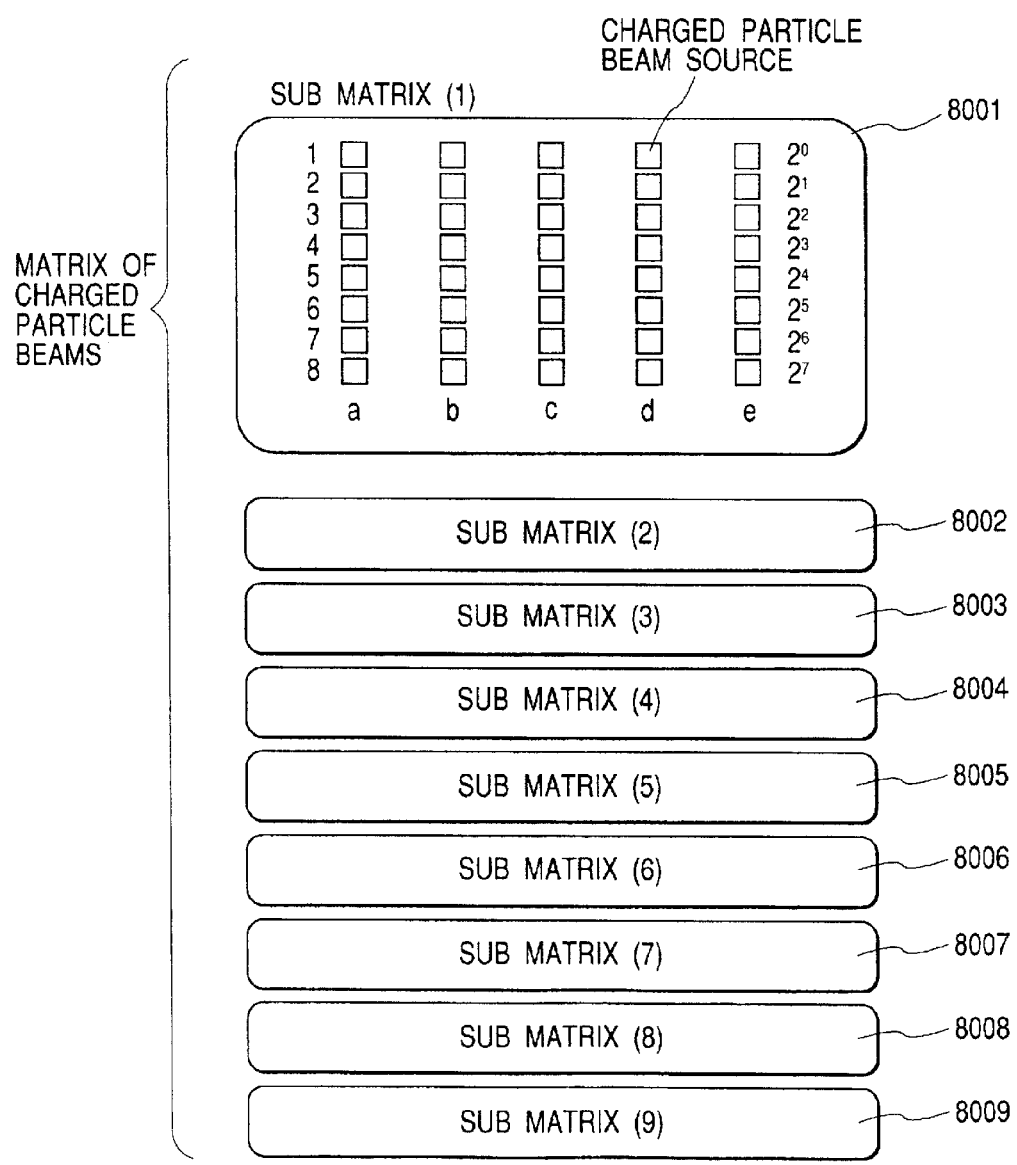
FIG. 19 is a view explaining a constitution of the matrix of charged particle beams having a sub-matrix constitution.
Figure 20:
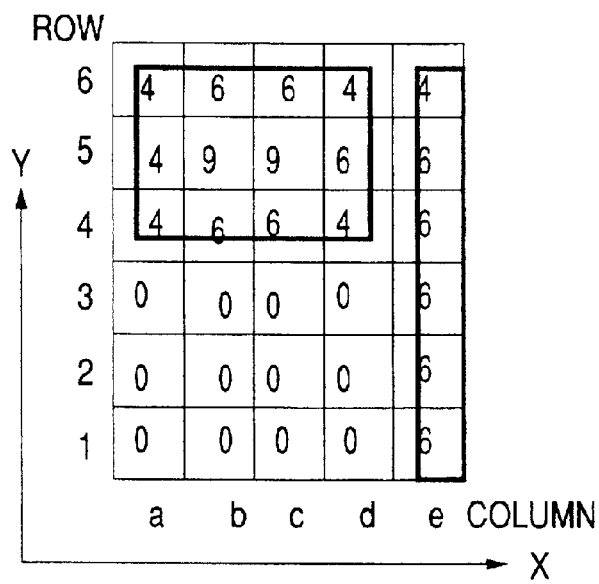
FIG. 20 is a view explaining an example of number data of exposure.
Figure 21:
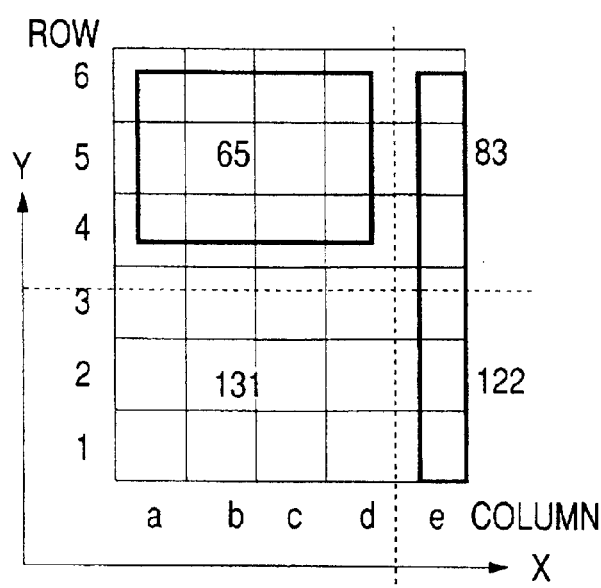
FIG. 21 is a view explaining an example of exposure dose data.

FIG. 20 is a number data map of exposure, where the dimension resolving power is considered. FIG. 21 is an exposure dose data map, where the proximate effect across a plurality of meshes is considered. To enable the correction of the exposure dose performed simultaneously with a regular exposure in accordance with the maps, a sub matrix of charged particle beams are provided by the maximum number of the number data of exposure relative to the matrix of charged particle beams explained in FIG. 14. Sub matrixes of charged particle beams (8001, 8002, 8003, 8004, 8005, 8006, 8007, 8008, 8009) in FIG. 19, FIG. 22 and FIG. 23 show such sub matrix.

The pattern shown in FIG. 20 is a result where the exposure dose is converted to the gradation number of each mesh in accordance with the ratio data. In this case, the maximum value of the gradation number was set at nine. Other than this gradation number, exposure dose data defined across a plurality of meshes are obtained. In this case, an existence density of the pattern, which is determined depending on how many patterns exist in the region across a plurality of the meshes, is calculated in every region across a plurality of meshes. An irradiation current quantity is controlled to be constant such that the exposure dose is reduced in the case of a high pattern existence density and increased in the case of a low pattern existence density at every region unit across a plurality of meshes. More specifically, in the proximate effect correction for controlling the charge quantity of the charged particle beams depending on the percentage of the patterns that exist in proximate regions, a map is formed in which the exposure dose is calculated depending on the pattern existence density for every region, which is allocated across a plurality of meshes as shown by dotted lines in FIG. 21. For example, in the case of an isolated pattern, that is, the case where no pattern exists in vicinities of a pattern, the charge quantity to be irradiated on the pattern is increased. In the case where the pattern exists in its vicinities, the charge quantity is reduced. Such a correction is performed to make sensitivity of the photosensitivity material to the charge quantity to be averaged, and thus dimension accuracy is obtained.

Figure 29:
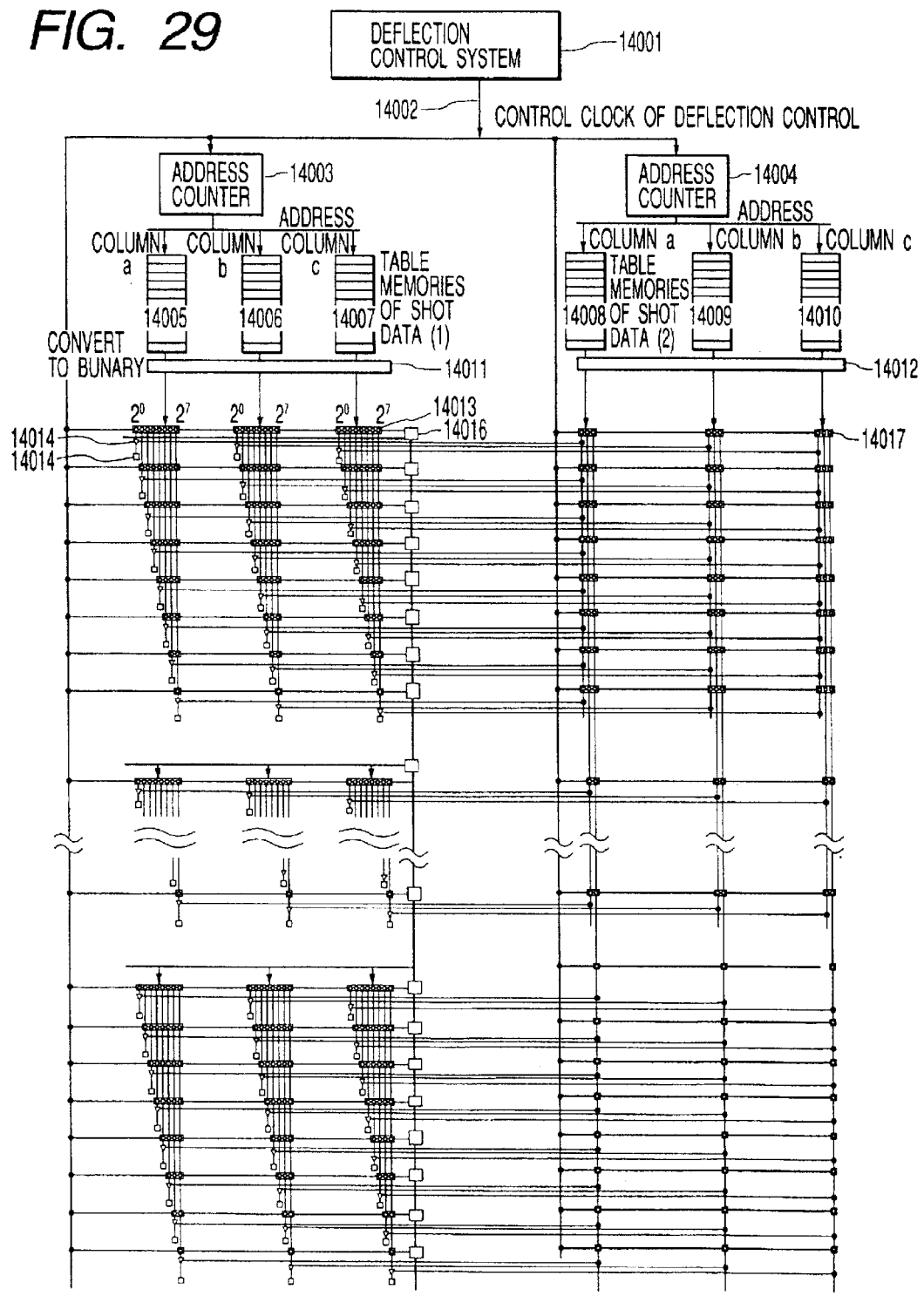
FIG. 29 is a view explaining a constitution of the control system of the matrix of charged particle beams having a sub-matrix constitution.

As described, both the dimension control by the number of shots in accordance with the pattern dimensions shown in FIG. 20 and a micro exposure control by the exposure dose across a plurality of meshes must be performed to execute writing by taking the highly accurate dimension controllability and the proximate effect correction in consideration. Moreover, to maintain a high throughput, both of the dimension control and the micro exposure control must be performed simultaneously. For this reason, as shown in FIG. 29, an exposure system is adopted that the exposure dose data as the data for the micro exposure control and the number data for exposure as the data for the dimension control are separately transferred to a plurality of the sub matrixes to control the charged particle beam source. FIG. 19 shows the sub matrixes in the case where the maximum value of nine of the number data is transferred, the number data being the data for controlling the dimension control. Although the drawing shows that the charged particle beams of the sub matrix are weighted in the column direction by $2^0$ to $2^7$ and arrayed, a part of which is omitted (similarly, in FIGS. 22 and 23). Both the dimension control and the micro exposure control can be simultaneously performed in the constitution of the sub matrix of charged particle beams. Description will be made with reference to FIGS. 22 and 23.

Figure 22:
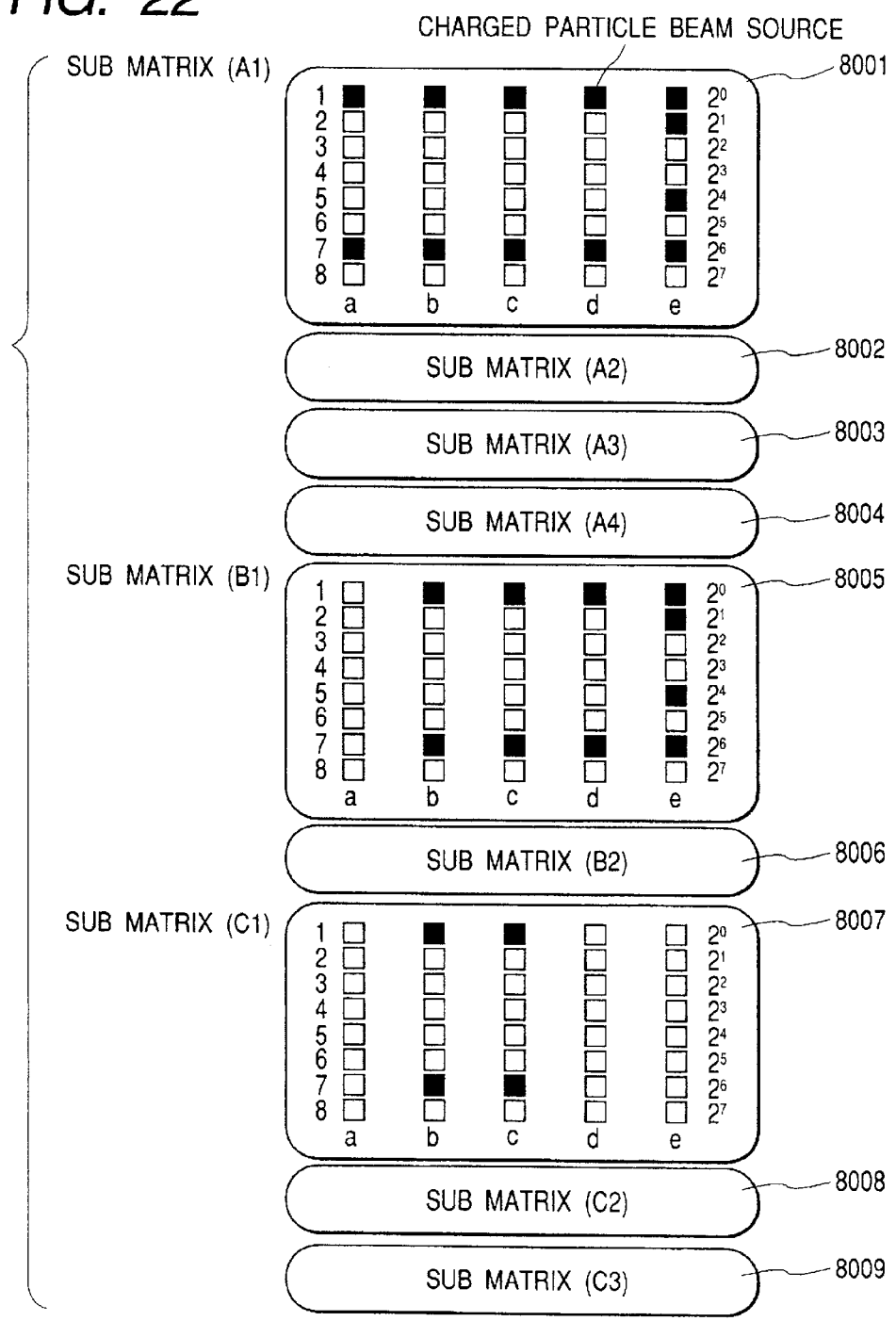
FIG. 22 is a view explaining an example of an exposure pattern of the matrix of charged particle beams.
Figure 23:
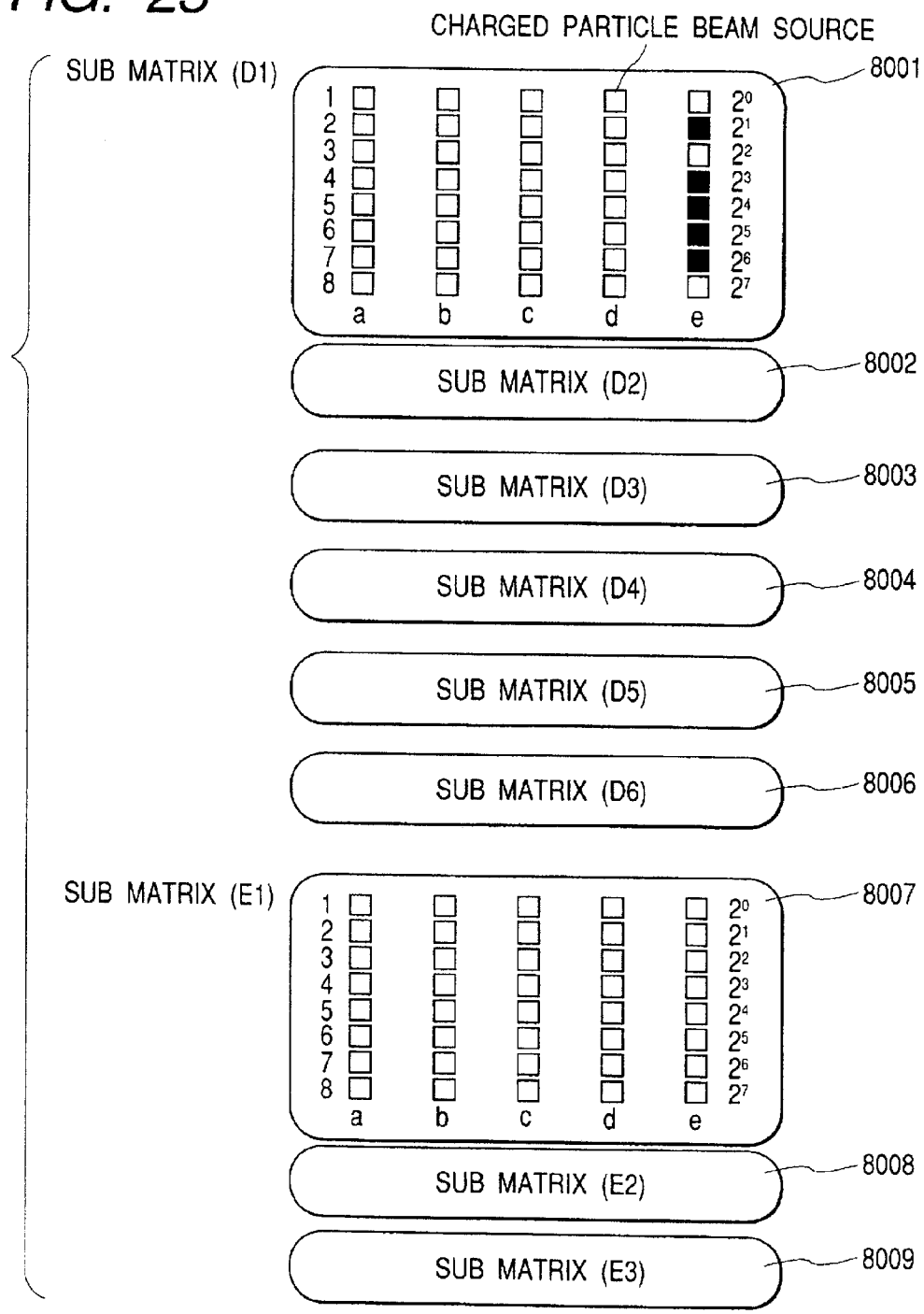
FIG. 23 is a view explaining an example of the exposure pattern of the matrix of charged particle beams.
Figure 24:
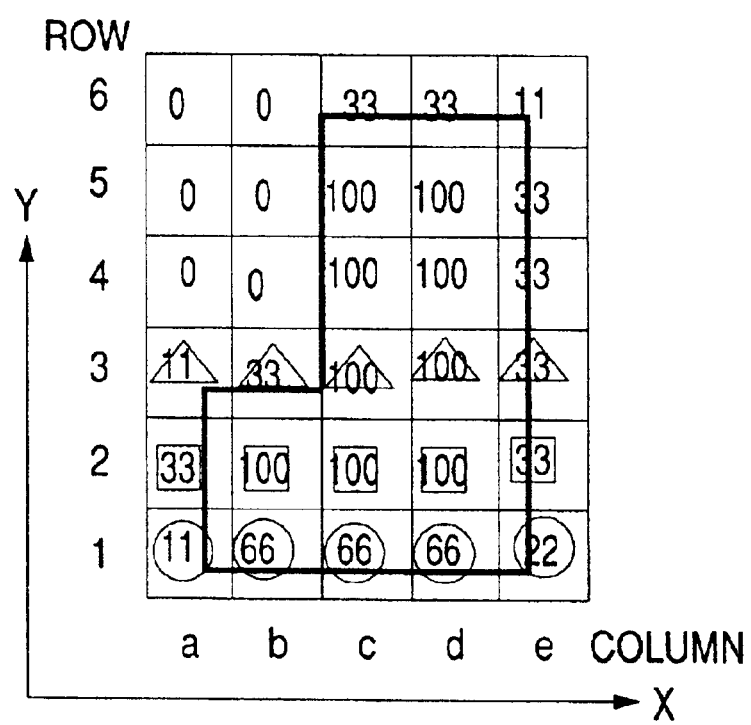
FIG. 24 is a view explaining an example of the number data of exposure.
Figure 25:
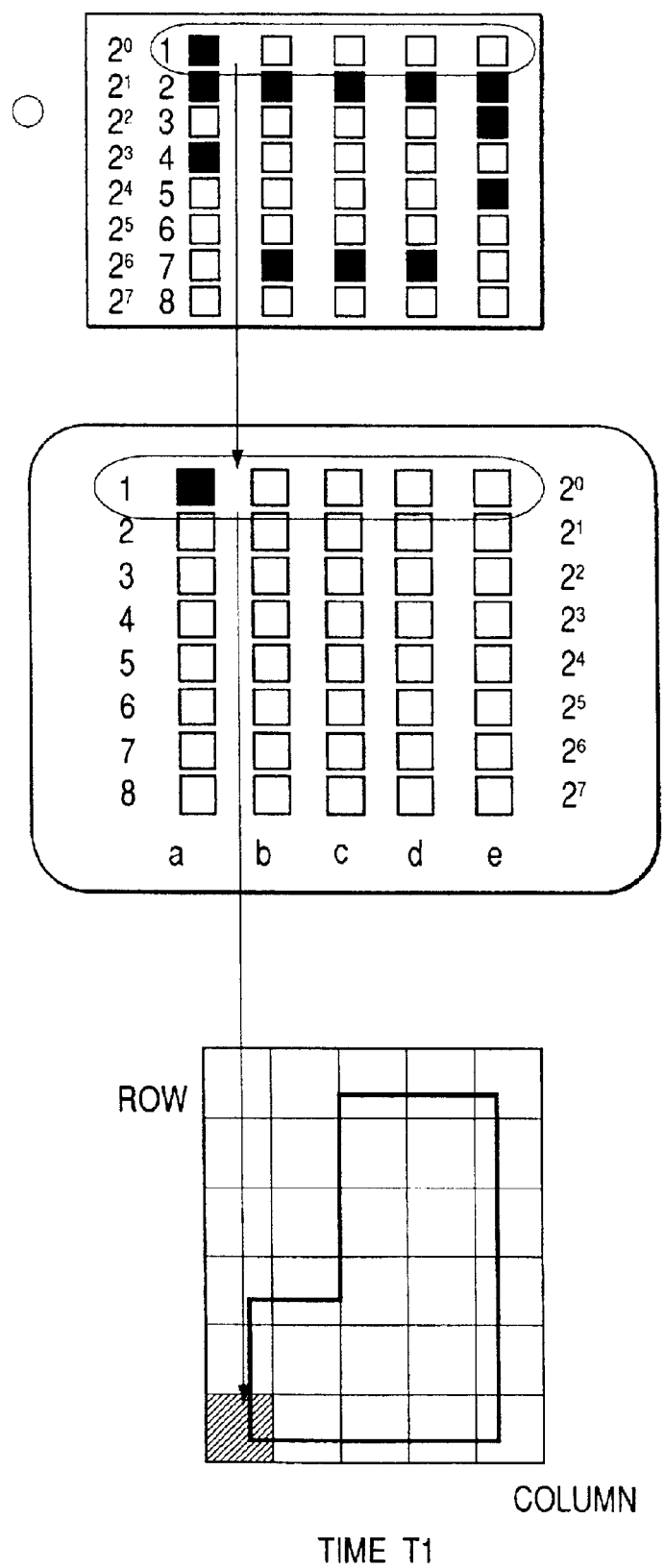
FIG. 25 is a view explaining a data setting procedure to the matrix of charged particle beams.
Figure 26:
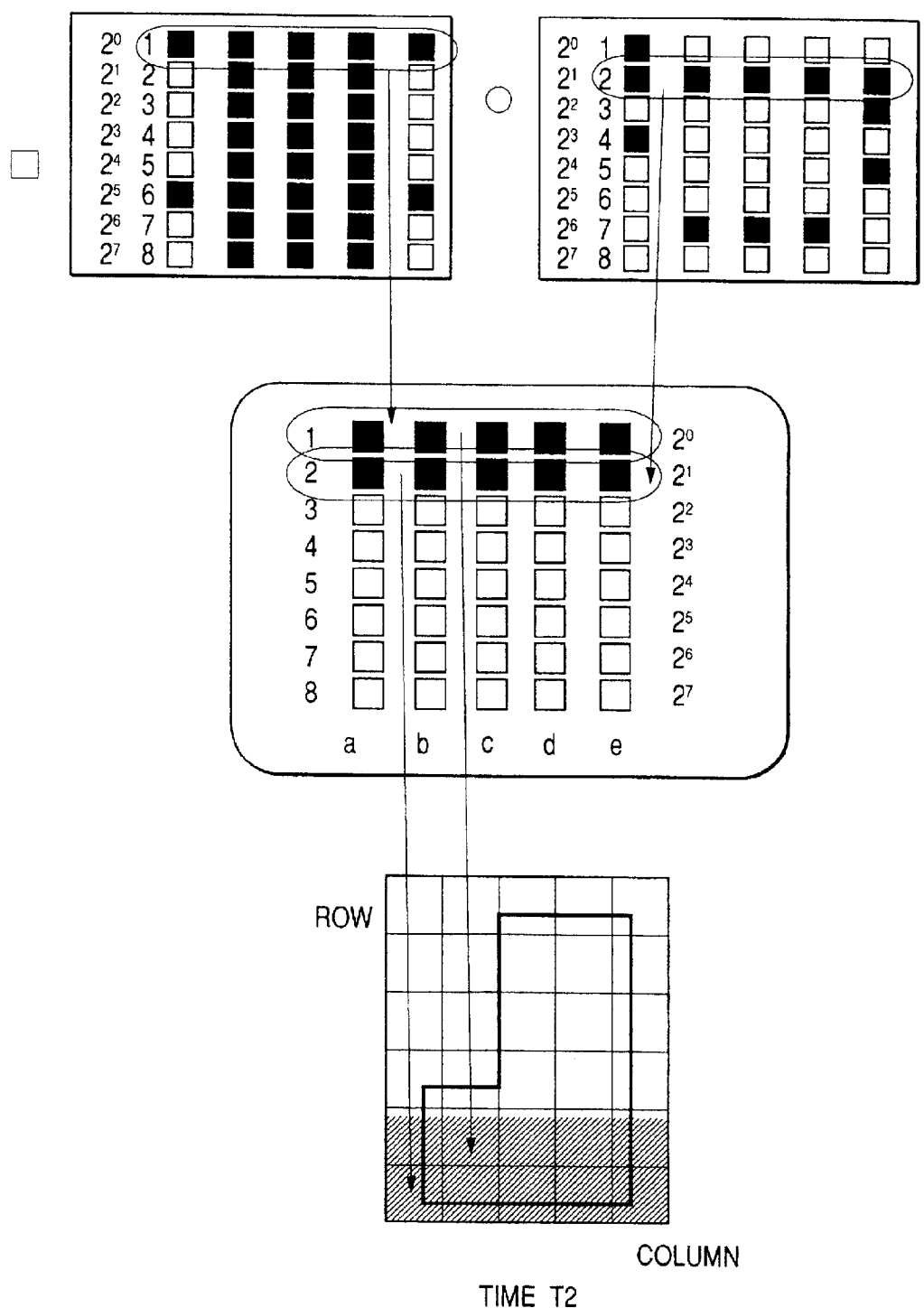
FIG. 26 is a view explaining the data setting procedure to the matrix of charged particle beams.
Figure 27:
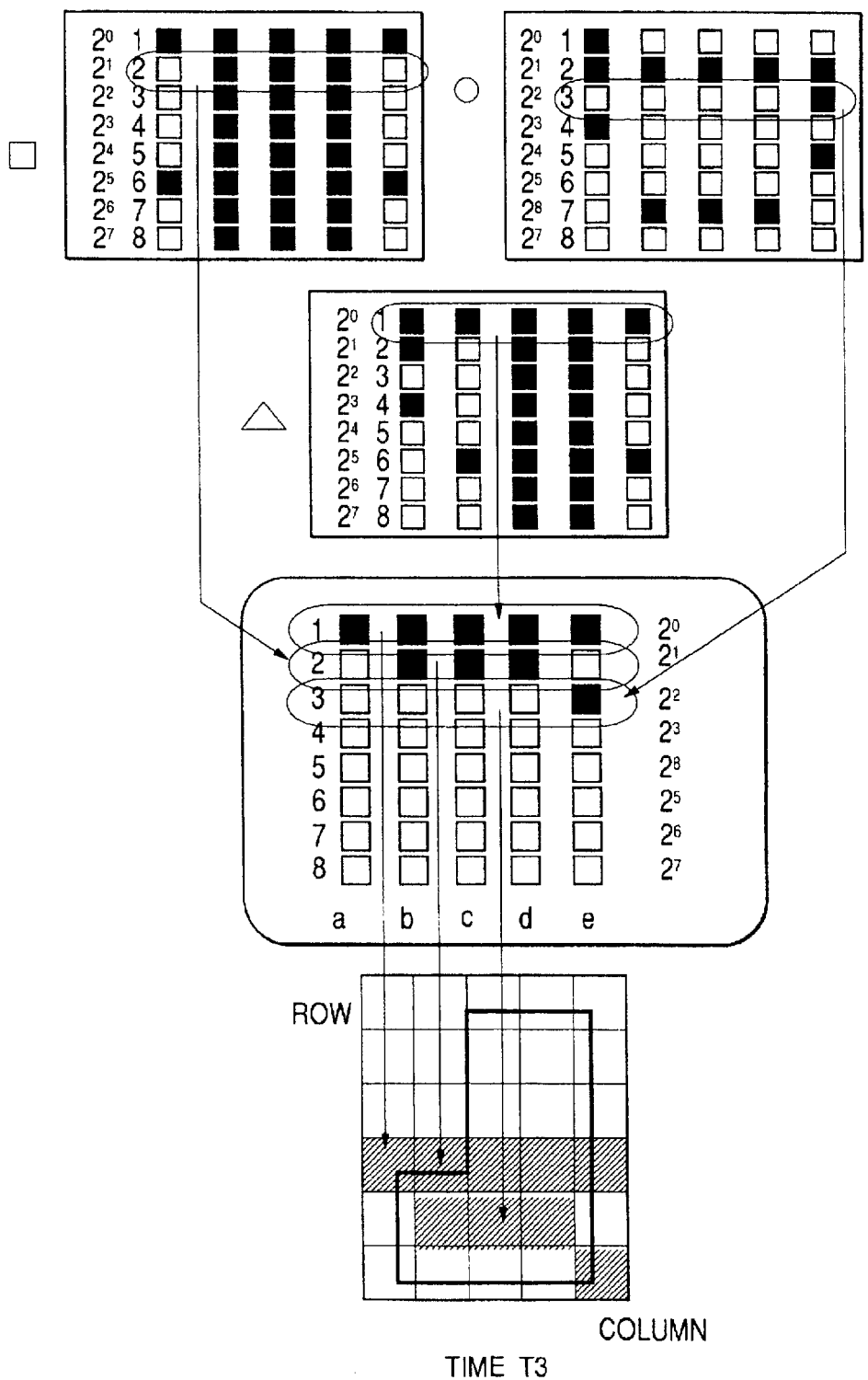
FIG. 27 is a view explaining the data setting procedure to the matrix of charged particle beams.

FIG. 22 shows the case where the fifth row of the number data map for irradiating the charged particle beams shown in FIG. 20 is exposed. Comparing with the number data map, in FIG. 21 as the exposure dose data map in which the proximate effect is considered across a plurality of meshes, the value in the same position (5, a) shows 65. FIG. 29 will describe a procedure for driving the charged particle beam source in the sub matrix shown in FIG. 19 to irradiate the charged particle beam on the sample depending on the value of the map. The maximum value on the number data map is set at nine. A mesh (5, a) has the number of exposure (gradation number) of four times and the exposure dose of 65. In other words, the number of sub matrixes is nine. FIG. 29 shows a circuit constitution connecting to three of these. The value of the number data map and the value of the exposure dose data map are stored. Supposing a time T2 is a starting point, the exposure dose data is delayed in a first shift register by a delayed amount corresponding to a binary weight. At a time T2, data of the exposure dose data map (6, a) is inputted to the first shift register. In this manner, data is read out sequentially from storage sections (14005 to 14007) to be inputted to the first shift register up to a time T8. At a time T9, the data inputted to the first shift register at the time T1 is inputted to a second shift register, and the value of the exposure data map (14, a) is simultaneously inputted to the first shift register. Similarly, at a time T17, the data inputted to the first shift register at the time T1 is inputted to a third shift register.

As it is understood from the above operation, the second, third and fourth shift registers have the same operation as the first shift register even at the different times. The amount specified in the number data map determines the number of same operation. The number data is sent from storage sections (14008 to 14010). For example, when the number data sent is four times, the data goes through a converter (14012) that converts a binary number to an unary number such that four pieces of "1" are outputted, and the data is inputted to a first shift register (14017) that delays the data. The least significant bit of the "a" column of the first shift register (14017) controls output of the "a" column of the first resister. The second bit of the "a" column controls output of the "a" column of the second shift register in the same manner. The least significant bit of the "b" column of the first shift register (14017) controls output of the "b" column of the first resister. The second bit of the "b" column controls output of the second shift register of the "b" column in the same manner. For example, if the data inputted to the first shift register (14017) at the time of T1 is: four [1111] for the "a" column; nine [111111111] for the "b" column; nine [111111111] for the "c" column; six [111111] for the "d" column; and six [111111] for the "e" column, a map (5, a) of FIGS. 20 and 21 is sequentially exposed by four sub matrixes 8001, 8002, 8003, 8004 of charges particle beams with the exposure dose of 65 in a superposing manner. A number data map (5, b) is exposed with the exposure dose of 65 by superposing for nine times. Accordingly, a mesh (5, b) is sequentially exposed by nine sub matrixes 8001 to 8009 of charged particle beams with the exposure dose of 65 in a superposing manner. A number data map (5, c) has the gradation number of nine and a coefficient of the micro exposure correction of 65. A mesh (5, c) is sequentially exposed by the nine sub matrixes 8001 to 8009 of charge particle beams with the exposure dose of 65 in a superposing manner. A number data map (5, d) is sequentially exposed by the sub matrixes 8001 to 8006 of charge particle beams with the exposure dose of 65 in a superposing manner. Accordingly, a mesh (5, e) is sequentially exposed by the sub matrixes 8001 to 8006 of charged particle beams with the exposure dose of 83 in a superposing manner. FIG. 23 shows the case where the first row of the pattern shown in FIG. 20 is exposed. Number data maps (1, a) to (1, d) are not exposed because the number data is 0. A number data map (1, e) has the number data of 6 and the exposure dose data of 122. Accordingly, the number data map (1, e) is sequentially exposed by the six sub matrixes 8001 to 8006 of charged particle beams with the exposure dose of 122 in a superposing manner.

Second Embodiment

FIGS. 24 to 27 are views showing how the data and exposure are processed on a time series by taking the matrix of charged particle beams having the constitution described in FIGS. 13 and 14.

This system is the one in which the exposure dose for the pattern to be exposed on the sample is divided in a mesh unit, the exposure dose data for every mesh is converted into a binary number of N bits to be stored, and then, the N bits of the binary number are shifted for N times by a control clock depending on the weight. Thus, the matrix of charged particle beams having N rows is driven.

More specifically, the exposure data of each mesh corresponding to a portion of the first row of the mesh is converted into a binary number at a time T1. For example, regarding the "a" column, the least significant bit is transferred to (1, a) of the matrix of charged particle beams without shifting, and the (1, a) on the mesh is irradiated. The second bit, after delayed by one clock by the control clock, that is, after the time T2, is transferred to (2, a) of the matrix of charged particle beams, and the (1, a) on the mesh is irradiated. In the same manner, the third bit, after delayed by two clocks by the control clock, that is, after the time T3, is transferred to (3, a) of the matrix of charged particle beams, and the (1, a) on the mesh is irradiated. In addition, regarding the "b" column, the least significant bit is transferred to (1, b) of the matrix of charged particle beams without shifting similarly to the "a" column, and the (1, b) on the mesh is irradiated. The second bit, after delayed by one clock by the control clock, that is, after the time T2, is transferred to (2, b) of the matrix of charged particle beams, and the (1, b) on the mesh is irradiated. In the same manner, the third bit, after delayed by two clocks by the control clock, that is, after the time T3, is transferred to (3, *b*) of the matrix of charged particle beams, and the (1, *b*) on the mesh is irradiated. At the time T2, the exposure dose of the second row is taken out from the storage section, and the least significant bit is transferred to (1,*a*) of the matrix of charged particle beams without shifting, and the (2, *a*) on the mesh is irradiated. The second bit, after delayed by one clock by the control clock, that is, after the time T3, is transferred to (2, *a*) of the matrix of charged particle beams, and the (2, *a*) on the mesh is irradiated. In the same manner, the third bit, after delayed by two clocks by the control clock, that is, after the time T4, is transferred to (3, *a*) of the matrix of charged particle beams, and the (2, *a*) on the mesh is irradiated. As described, the system is the one in which the meshes are allocated to all the patterns on the sample in advance, the exposure dose to each mesh is determined, and the exposure is completed by utilizing a time delay.

At the time T1 (exposure starting time), the data of the first row marked with a circle in the drawing is given. This data is converted into a binary number. Among the data, the data of a bit having the weight of the zero power of 2 is given to the first row of each column of the matrix of charged particle beams. Since the time T1 is the exposure starting time, 0 is set to the other rows. In the case of this example, only (1, *a*) of the matrix of charged particle beams is turned on at the time T1. The beam is irradiated on (1, *a*) of the mesh on the sample.

At the time T2, the data of the second row marked with a square mark in the drawing is given in addition to the foregoing data. This data is also converted into a binary number. Among the data, the data of a bit having the weight of the first power of 2 of the data with the circle mark is given to the second row of each column of the matrix of charged particle beams. In addition, the data having the weight of the zero power of 2 of the data with the square mark is given to the first row of each column of the matrix of charged particle beams. 0 is set to the other rows. In the case of this example, all of the first and second rows of each column of the matrix of charged particle beams are turned on at the time of T2. The beam of the first row is irradiated on the second row of the mesh on the sample. The beam of the second row is irradiated on the first row of the mesh on the sample.

At the time T3, the data of the third row marked with a triangle mark in the drawing is given in addition to the foregoing data. This data is also converted into a binary number. Among the data, the data of a bit having the weight of the second power of 2 of the data with the circle mark is given to the third row of each column of the matrix of charged particle beams. In addition, the data having the weight of the first power of 2 of the data with the square mark is given to the second row of each column of the matrix of charged particle beams. Further, the data having the weight of the zero power of 2 of the data with the triangle mark is given to the first row of each column of the matrix of charged particle beams. 0 is set to the other rows. In the case of this example, all the columns of the first row, "b", "c" and "d" columns of the second row and (3, e) of the matrix of charged particle beams are turned on at the time T3. The beam of the first row is irradiated on the third row of the mesh on the sample, the beam of the second row is irradiated on the second row of the mesh on the sample, and the beam of the third row is irradiated on the first row of the mesh on the sample.

Thereafter, this operation will be repeated. In the case where the matrix of charged particle beams is in the constitution shown in FIG. 19, the foregoing operation will be repeated for every sub matrix.

Third Embodiment

Figure 28:
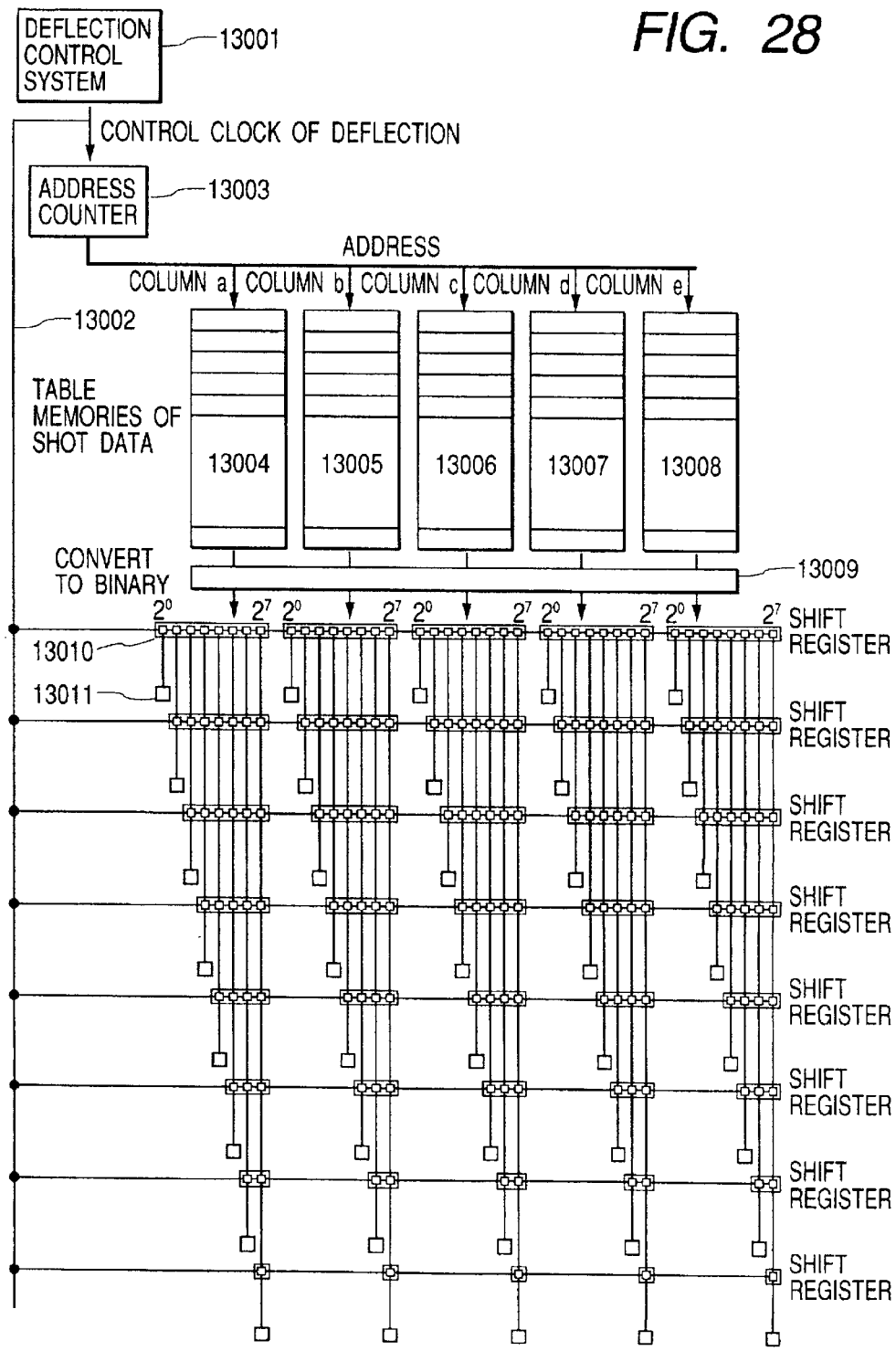
FIG. 28 is a view explaining a constitution of a control system of the matrix of charged particle beams.

FIG. 28 is the view showing the constitution of the control system that controls the matrix of charged particle beams in FIG. 14 (1, to 8, a to e) having the constitution described in FIGS. 13 and 14. The matrix of charged particle beams is in the constitution of eight rows and five columns. Each shot data is stored in table memories (13004 to 13008) of shot data provided for each column in advance. A timing for reading out the shot data from the table memories of shot data is determined by a control clock 13002 of deflection control circuit. An address is determined by counting the control clock 13002 of deflection control circuit with an address counter 13003. The data read out is converted into a binary number of 8 bits. The constitution is made such that the converted data is taken into a shift register 13010 provided for every bit by synchronizing with the control clock 13002 of deflection control circuit. The constitution is also made such that deflection of the deflection unit is performed for every mesh unit on the sample at every counting of the clock C1.

When the control clock C1 of deflection control circuit is generated at the time of T1, an output value of the address counter is determined and a reading address AD1 of the table memories of shot data is also determined. Then, shot data DT1 stored in the address AD1 is read out, converted in a binary converter, and sent to each shift register. Each shift register transfers each data to a next shift register connected thereto and takes in data that has been sent. And then, the data of the bit having the weight of the zero power of 2 of the shot data DT1 is given to a matrix 13011 of charged particle beams (which corresponds to (1,a) of FIG. 14), and on (a black square mark) and off (a white square mark) of the beams are controlled in accordance with the data.

Next, at the time of T2, the control clock C2 of deflection control circuit is generated. Accordingly, an address AD2 is determined, and data DT2 stored in the AD2 is read out, converted into a binary number, and sent to the shift register. Each shift register transfers each data to a next shift register connected thereto and takes in data that has been sent. At the time T2, the data of the bit having the weight of the zero power of 2 of the shot data DT2 is given to the beams constituting the matrix of charged particle beams. Thus, on/off of the beams are controlled. Moreover, the data having the weight of the first power of 2 of the shot data DT1 is given to the beams constituting the matrix of charged particle beams. Thus, on/off of the beams are controlled.

Next, at the time of T3, the control clock C3 of deflection control circuit is generated. Accordingly, an address ADS is determined, and data DT3 stored in the AD3 is read out, converted into a binary number, and sent to the shift register. Each shift register transfers each data to a next shift register connected thereto and takes in data that has been sent. At the time T3, the data of the bit having the weight of the zero power of 2 of the shot data DT3 is given to the beams constituting the matrix of charged particle beams. Thus, on/off of the beams are controlled. Moreover, the data of the bit having the weight of the 1st power of 2 of the shot data DT2 is given to the beams constituting the matrix of charged particle beams. Thus, on/off of the beams are controlled. Furthermore, the data of the bit having the weight of the second power of 2 of the shot data DT1 is given to the beams constituting the matrix of charged particle beams. Thus, on/off of the beams are controlled. Hereinafter, the above operations are repeated.

Fourth embodiment

FIG. 29 is a constitution example of a control system when the matrix of charged particle beams has a sub matrix constitution. The number of the sub matrixes is determined by deciding the minimum dimension resolving power for an area (dimensions) of the charged particle beam source 1004 shown in FIG. 1. For example, in FIG. 29, when the dimension of an electron source is 18 nm and the minimum dimension resolving power is set at 6 nm, the number of the sub matrixes becomes three. In other words, pattern of 6 nm is written per one shot. Each sub matrix in FIG. 29 has a constitution of eight rows and three columns. In this case, there are two kinds of data for controlling the matrix of charged particle beams. For example, one is shot number data associated with the dimension control, and the other is micro exposure dose data for averaging the proximate effect across a plurality of meshes, that is, the exposure dose. The micro exposure dose data is stored in table memories (1) (14005, 14006, 14007) of shot data. The shot number data associated with the dimension control is stored in table memories (2) (14008, 14009, 14010) of shot data. Regarding an address of each table memory of shot data, the one is used in which a control clock 14002 of deflection control circuit synchronized with the operation of a deflection control system 14001 is counted with address counters 14003 and 14004. Reference numerals 14013, 14016 and 14017 denote shift registers. A charged particle beam source 14015, (which corresponds to (1, *a*) of FIG. 14), that constitutes the matrix of charged particle beams is controlled to turn on/off depending on the data from the shift registers.

On the other hand, the shot number data goes from the table memories (2) (14008, 14009, 14010) of shot data through a unary-coded decimal converter (14012), and the beams connected to the shift registers are controlled to turn on/off. For example, when the shot number is set at two times, two ones are set at the output of the decimal-to-binary converter, which causes sub matrixes 1 and 2 of charged particle beams to be in an operation state and a sub matrix 3 of charged particle beams to be in an non operation state. With this connection system, the number of superposing by the minimum dimension resolving power and a corrected exposure dose per one shot are multiplied for exposure.

Next, description will be made for a method for allowing each electron beam to have a different current quantity. The method to be described in the following can be commonly utilized for each embodiment described above.

Figure 30:
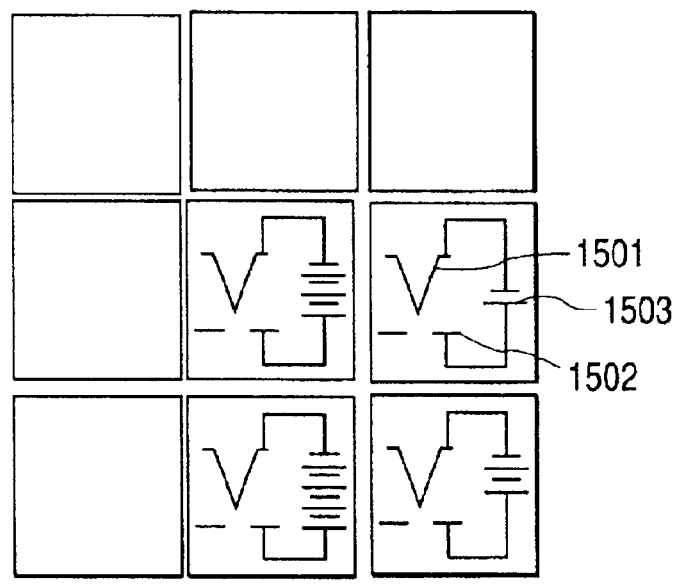
FIG. 30 is a view explaining a system for varying a current quantity by a bias condition.
Figure 31:
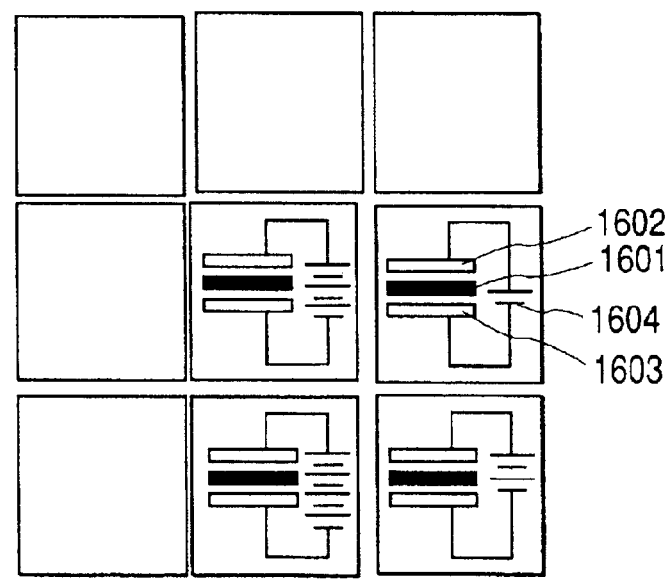
FIG. 31 is a view explaining the system for varying the current quantity by the bias condition.

FIGS. 30 and 31 are views explaining the method for allowing each electron beam to have a different current quantity in the case where the matrix of charged particle beams is constituted of an electron source such as a field emission type electron source and an MIM electron source. In the electron source, a current value can be controlled by a bias state given thereto. In the case of the field emission type electron source, a power source 1503 connected between an electron source chip 1501 and a leading electrode 1502 shown in FIG. 30 is varied. In the case of the MIM electron source, a power source 1601 connected between electrodes 1602 and 1603 that sandwich an insulation film 1601 is varied. As shown above, the bias state is independently set for every electron source as in this embodiment. Therefore, the matrix of charged particle beams can have any mode among the cases where irradiation charge quantities of all charged particle beams are equal, different or weighted at a certain ratio.

Figure 32:
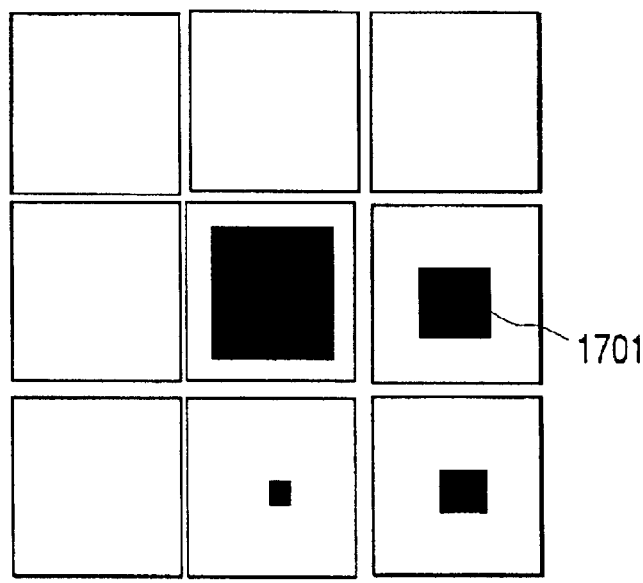
FIG. 32 is a view explaining a system for varying the current quantity by an emission area size.
Figure 33:
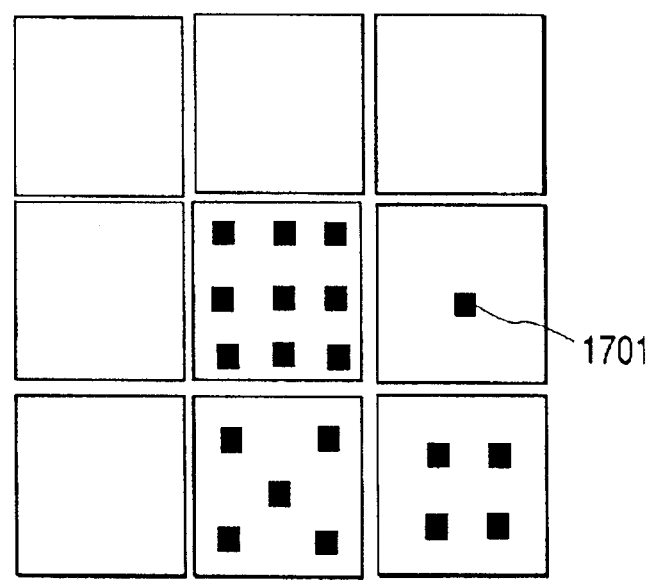
FIG. 33 is a view explaining the system for varying the current quantity by the emission area size.

FIGS. 32 and 33 are views explaining the method for allowing each electron beam to have a different current quantity in the case where the matrix of charged particle beams is constituted of an electron source such as the MIM electron source. In the MIM electron source, the current value can be controlled by controlling an area of an electron emission portion 1701. FIG. 32 shows the case where the current quantity is controlled by varying an electron emission area, and the current quantity is determined by forming the emission area large or small. FIG. 33 shows the case where the current quantity is controlled by the integration number of the electron emission portions having a certain size, which has the same effect as the case of FIG. 32. As shown above, the electron emission area is independently set for every electron source as in this embodiment. Therefore, the matrix of charged particle beams can have any mode among the cases where irradiation charge quantities of all charged particle beams are equal, different or weighted at a certain ratio.

In a constitution where the size of a surface electron source corresponds to the dimension resolving power, an enormous number of surface electron sources are required and the number of wires and circuits also become enormous, which is unable to be achieved. On the other hand, the present invention is characterized in that writing is performed in dimensions smaller than the size of the surface electron source. The present invention provides a circuit constitution in which the beam current quantity of the surface electron source is controlled and the dimension accuracy equal to the size of the surface electron source or less is realized. As it is understood from the circuit constitution of the embodiments, the memories of the storage section and the shift registers of the delay circuit form a basic constitution. Therefore, the present invention is also characterized in that the circuit constitution is suitable for an IC circuit combined with the surface electron source.

As described above, according to the method and the apparatus of the charged particle beam exposure, writing of a plurality of circuit patterns on the sample can be performed freely and flexibly without using a mask. Even if the mesh allocated on the sample has large dimensions, the gradation number can be set by finely controlling the irradiation charge quantity of the charged particle beams. Accordingly, a high resolving power can be obtained in the control resolving power of the pattern dimensions. This system solves the problems of an enormous number of surface electron sources and a transfer rate in a data transfer, which occur in a system of transferring data by arranging the surface electron sources corresponding one by one to the sample pattern. The system also can be integrally constituted with the surface electron sources in a circuit suitable for an IC. Since the number of beams constituting the matrix of charged particle beams can be reduced significantly (the number of charged particle beam sources can be reduced), simplification of the matrix beam control circuit, reduction of a packaging size and the like are enabled. Moreover, the number data map for irradiating the charged particle beams and the exposure dose data map in which the proximate effect across a plurality of meshes is considered can be formed in a high speed. In addition, the system has a constitution in which the number data map and the exposure dose data map are simultaneously controlled, and thus the throughput of the exposure is improved.

What is claimed is:

1. A method for charged particle beam exposure using a plurality of charged particle beams to be irradiated on a sample and using exposure data for exposing a predetermined pattern on a sample, the charged particle beams being arranged in a matrix consisting of a row component and a column component and having different current quantities in a column direction, said method comprising the steps of:

generating control data by converting said exposure data into data for setting the number of turning on/off of a plurality of said charged particle beams arranged in said matrix in accordance with a line width of the predetermined pattern to control a plurality of said charged particle beams;

transferring said control data to a control unit for controlling a plurality of said charged particle beams arranged in said matrix; and deflecting a plurality of said charged particle beams such that a plurality of said charged particle beams arranged in the column direction of said matrix are irradiated on different positions on the sample by data transferred to said control unit at a same time and are irradiated on a same position on the sample by data transferred to said control system at different times.

2. The method for charged particle beam exposure according to claim 1, wherein a plurality of said charged particle beams are weighted in powers of 2 to have different charge quantities.

3. An apparatus for charged particle beam exposure having a plurality of charged particle beam sources for irradiating on a sample and exposure data for exposing a predetermined pattern on a sample, a plurality of the charged particle beam sources being arranged in a matrix consisting of a row component and a column component and having different current quantities in a column direction, said apparatus comprising:

a conversion section for converting said exposure data into data for setting the number of turning on/off of a plurality of charged particle beams arranged in said matrix in accordance with a line width of the predetermined pattern to control a plurality of said charged particle beams;

a storage section for storing the data converted in said conversion section;

a shift register for setting a delay amount for the data from said storage section, the data being converted into a binary number, in accordance with a weight amount;

a control unit for controlling said charged particle beam source with output from said shift register; and a deflection unit for deflecting a plurality of said charged particle beams such that a plurality of said charged particle beams arranged in the column direction of said matrix are irradiated on different positions on the sample by data transferred to said control unit at a same time and are irradiated on a same position on the sample by data transferred to said control unit at different times.

4. The apparatus for charged particle beam exposure according to claim 3, wherein said exposure dose data is converted into a binary number, and connection is made between output of the binary number, each digit thereof having a weight at a power of 2, and a plurality of said charged particle beam sources in said matrix state, each having a weight in a ratio of a power of 2, such that the weights of each digit of the output and each said charged particle beam source coincide with each other.

5. An apparatus for charged particle beam exposure having a plurality of charged particle beam sources in a matrix and exposure data for exposing a predetermined pattern on a sample, a plurality of the particle beam sources having different current quantities, comprising:

a control system for controlling a plurality of said charged particle beam sources having the different current quantities;

a storage section for separating said exposure data into two systems of number data depending on a dimension resolving power and exposure dose data at the time of exposure of a single charged particle beam, and for storing said separated number data and exposure dose data;

a first shift register setting a delay amount for the exposure dose data from said storage section in accordance with a weight amount;

a second shift register setting a delay amount for the number data from said storage section in accordance with a weight amount of said first shift register; and a deflection unit for deflecting a plurality of said charged particle beams such that a plurality of said charged particle beams arranged in the column direction in said matrix are irradiated on different positions on the sample by data transferred to said control unit at a same time and are irradiated on a same position on the sample by data transferred to said control system at different times.

6. The apparatus for charged particle beam exposure according to claim 5, wherein said first shift register comprises an operation section for operating said exposure dose data and said number data.

7. The apparatus for charged particle beam exposure according to claim 5, wherein a plurality of said charged particle beam sources are arranged such that current emission areas of said charged particle beam sources in the matrix state are the same in a row direction and different in a column direction.

* * * * *